(12) United States Patent  (10) Patent No.: US 6,302,100 B1
Vandenberg  (45) Date of Patent: Oct. 16, 2001

(54) SYSTEM FOR COLLIMATING AND CONCENTRATING DIRECT AND DIFFUSED RADIATION

(75) Inventor: Leonard B. Vandenberg, Scotia, NY (US)

(73) Assignee: Leonard Vandenberg, Scotia, NY (US)

( * ) Notice: Subject to any disclaimer, the term of this patent is extended or adjusted under 35 U.S.C. 154(b) by 0 days.

(21) Appl. No.: 08/873,214

(22) Filed: Jun. 11, 1997

Related U.S. Application Data

(60) Provisional application No. 60/019,583, filed on Jun. 12, 1996.

(51) Int. Cl.$^7$ .................................................. F24J 2/08
(52) U.S. Cl. ........................... 126/698; 126/683; 126/685; 126/699
(58) Field of Search ................. 126/683, 698, 126/699, 700, 685; 359/593, 569; 136/259, 246

(56) References Cited

U.S. PATENT DOCUMENTS

| | | | |
|---|---|---|---|
| 593,045 | * 11/1897 | Cummings | 126/689 |
| 719,066 | * 1/1903 | Wadsworth | 359/593 |
| 720,138 | * 2/1903 | Hartung | 359/594 |
| 737,979 | * 9/1903 | Wadsworth | 359/595 |
| 865,136 | * 9/1907 | Wadsworth | 359/593 |
| 982,772 | * 1/1911 | Wadsworth | 359/593 |
| 1,390,258 | * 9/1921 | Geneste | 126/689 |
| 2,976,759 | * 3/1961 | Bleuer | 359/613 |
| 3,213,753 | * 10/1965 | Rogers | 359/622 |
| 3,254,556 | * 6/1966 | Staunton | 359/615 |
| 3,255,665 | * 6/1966 | Weiher et al. | 359/595 |
| 3,393,034 | * 7/1968 | Imai | 359/593 |
| 3,467,840 | * 9/1969 | Weiner | 126/690 |
| 4,002,499 | 1/1977 | Winston . | |
| 4,003,638 | * 1/1977 | Winston | 126/698 |
| 4,050,789 | * 9/1977 | Herbert | 126/698 |
| 4,074,704 | * 2/1978 | Gellert | 126/683 |
| 4,103,673 | * 8/1978 | Woodsworth et al. | 126/698 |
| 4,114,592 | * 9/1978 | Winston | 126/698 |
| 4,176,655 | * 12/1979 | Levy | 126/689 |
| 4,257,401 | * 3/1981 | Daniels | 126/689 |
| 4,279,244 | * 7/1981 | McAlister | 126/698 |
| 4,307,936 | * 12/1981 | Ochiai | 126/684 |
| 4,389,085 | * 6/1983 | Mori | 359/591 |
| 4,456,783 | * 6/1984 | Baker | 126/686 |
| 4,505,264 | * 3/1985 | Tremblay | 126/689 |
| 4,511,755 | * 4/1985 | Mori | 126/689 X |
| 4,541,414 | * 9/1985 | Mori | 126/698 |
| 4,607,616 | * 8/1986 | Lehmann | 126/669 |
| 4,809,523 | * 3/1989 | Vandenberg | 62/483 |
| 5,048,925 | * 9/1991 | Gerritsen et al. | 359/593 |

* cited by examiner

*Primary Examiner*—James C. Yeung
(74) *Attorney, Agent, or Firm*—Klarquist Sparkman, LLP

(57) ABSTRACT

A method is disclosed for collimating light energy falling randomly from myriad directions on a fixed-positioned thin flat surface. The collimated rays are then concentrated by an assembly of prismatic slabs and optical or fiber optic means to achieve light concentrations of 700 or more times than that of normal sunlight. Applications are given for new products such as collimated beam non-blinding motor vehicle headlights; fixed-positioned solar collectors that collect and concentrate more than 80% of the direct and diffused radiation falling on their surfaces; generation of high pressure steam by means of solar energy; and efficient and economical photovoltaic and thermoelectric generators and fiber optic acceptors for concentrating and transmitting significant quantities of light energy.

3 Claims, 12 Drawing Sheets

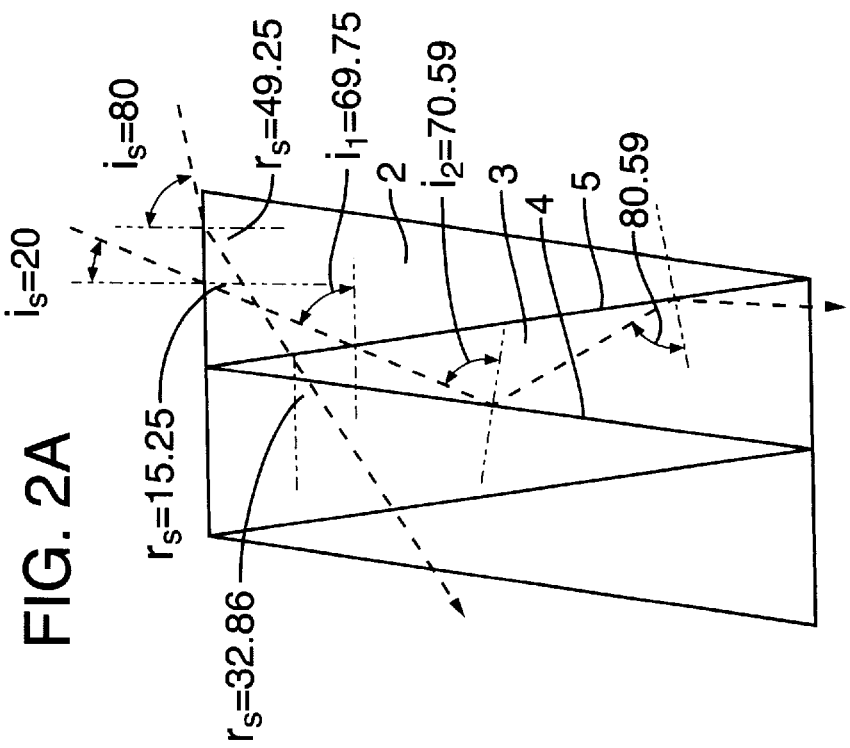
FIG. 2A
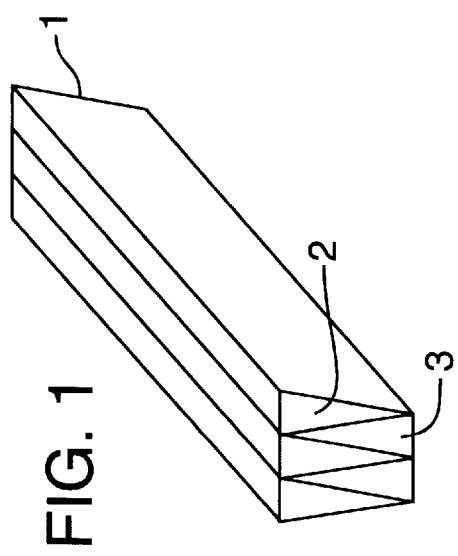
FIG. 1
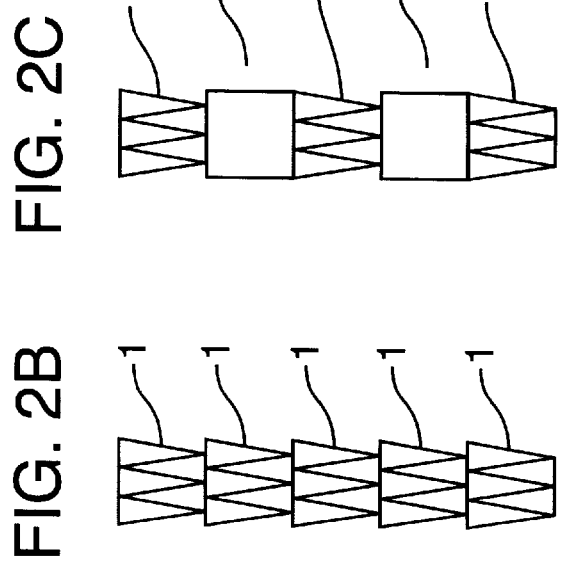
FIG. 2B
FIG. 2C

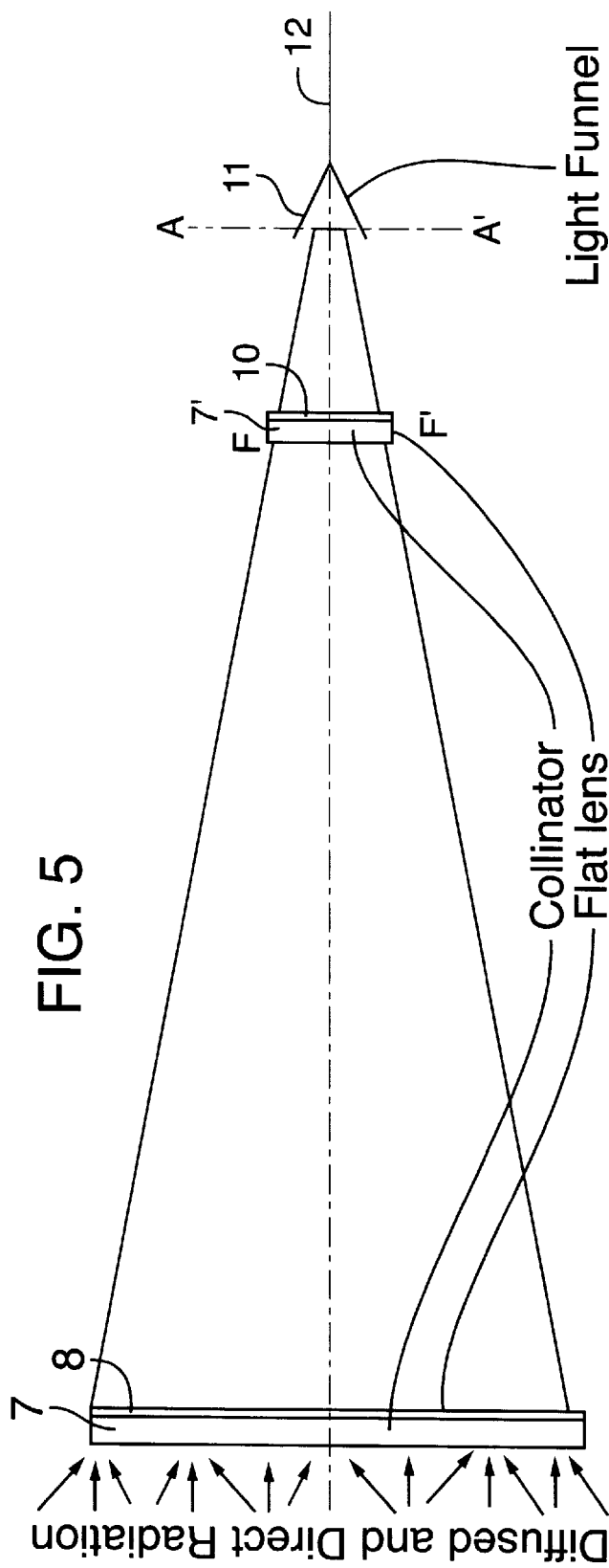

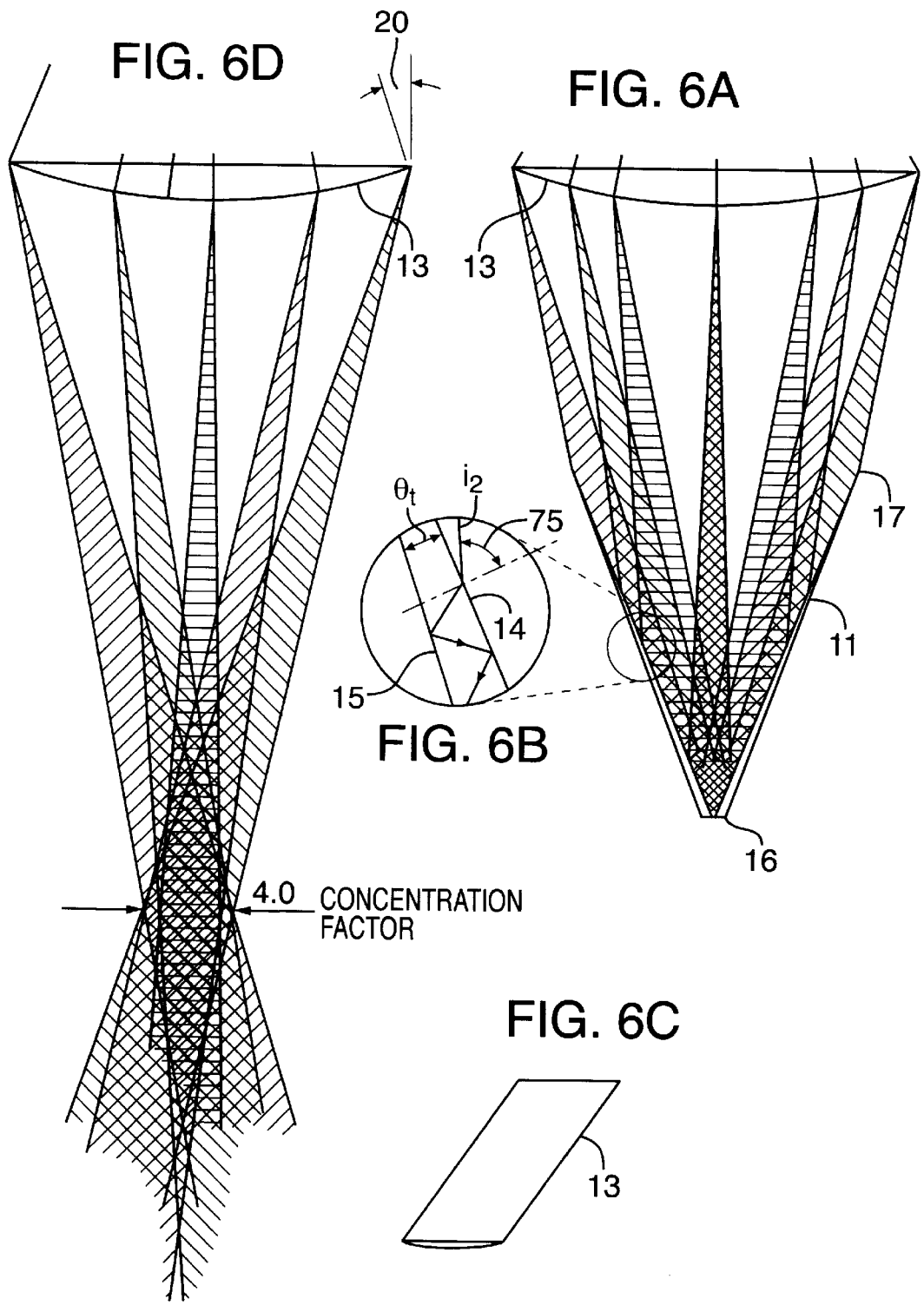

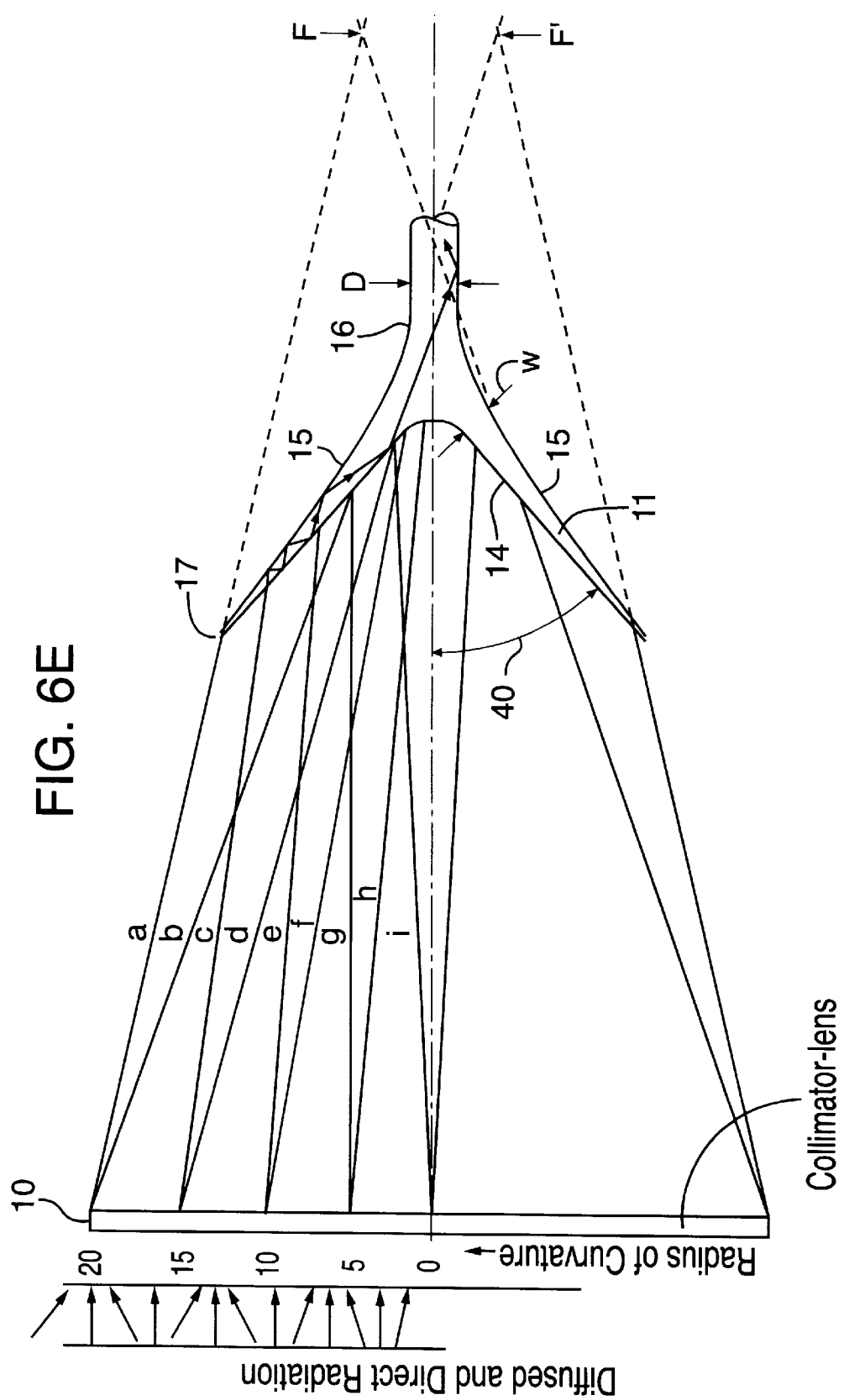

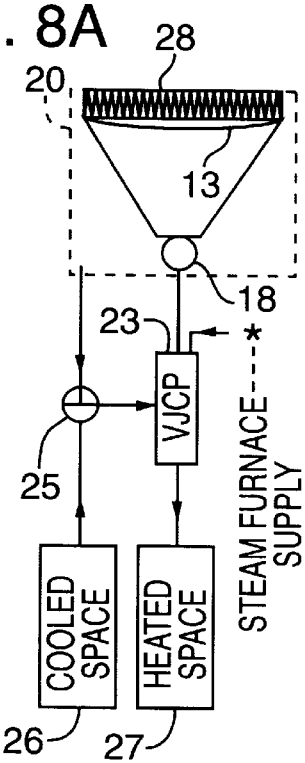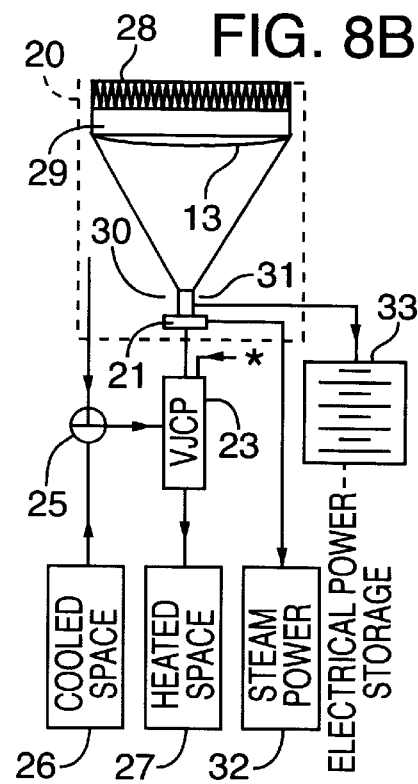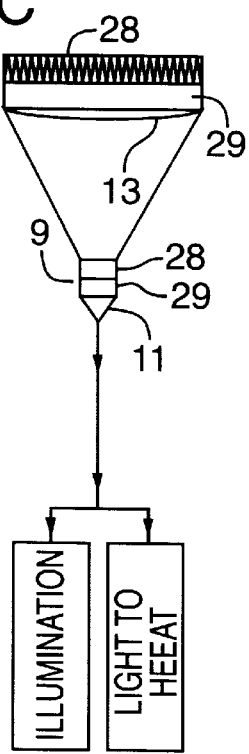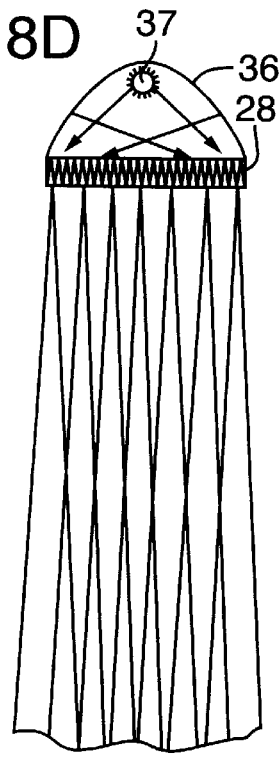

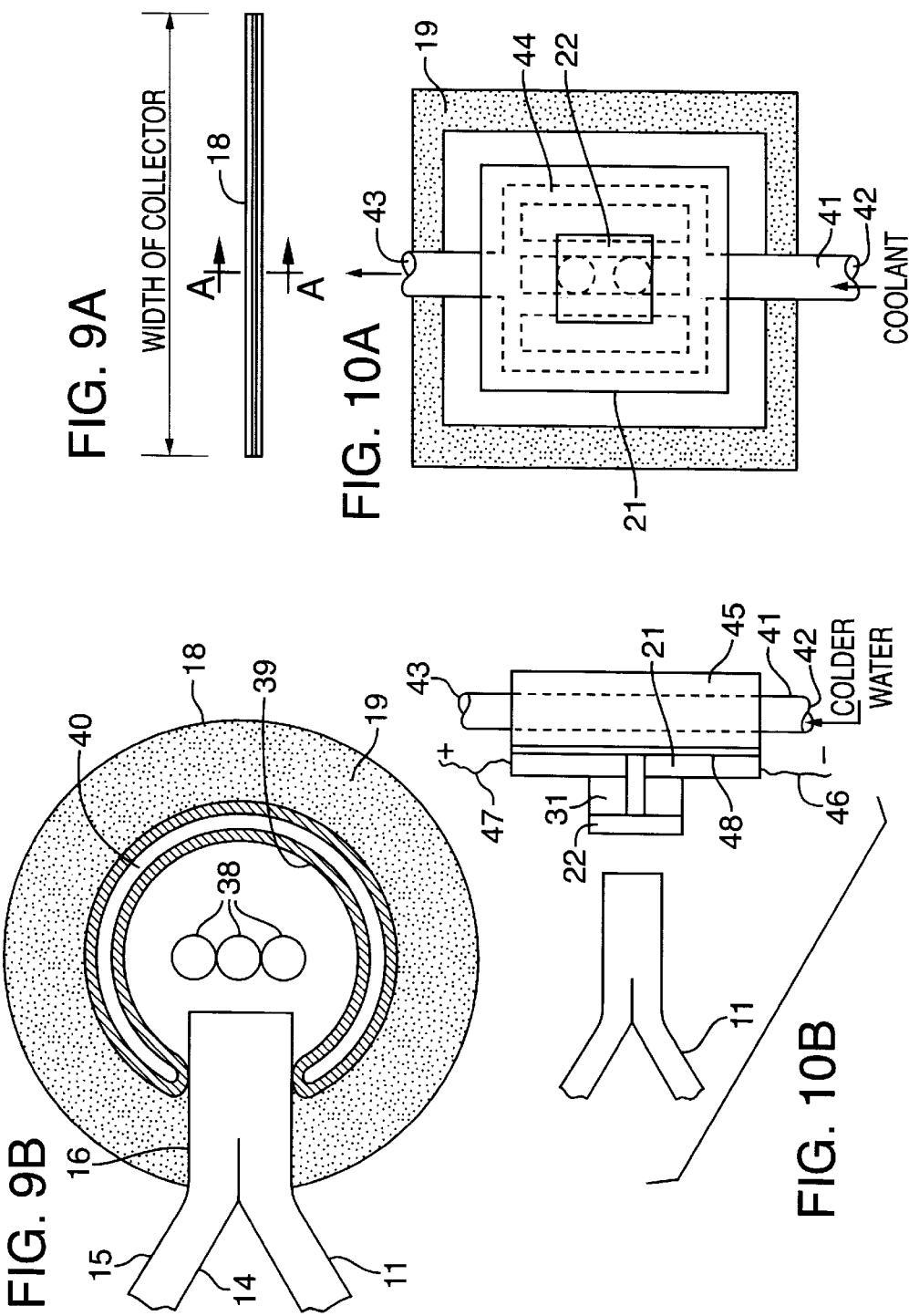

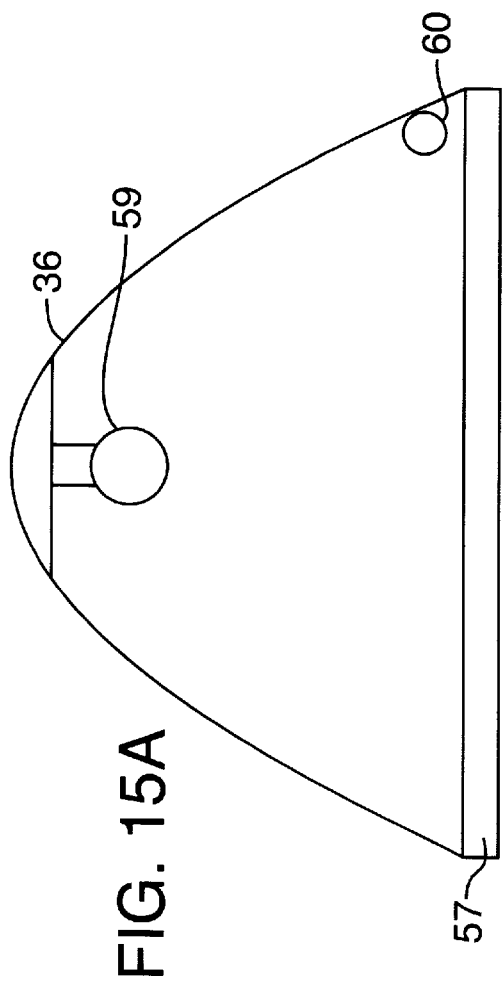
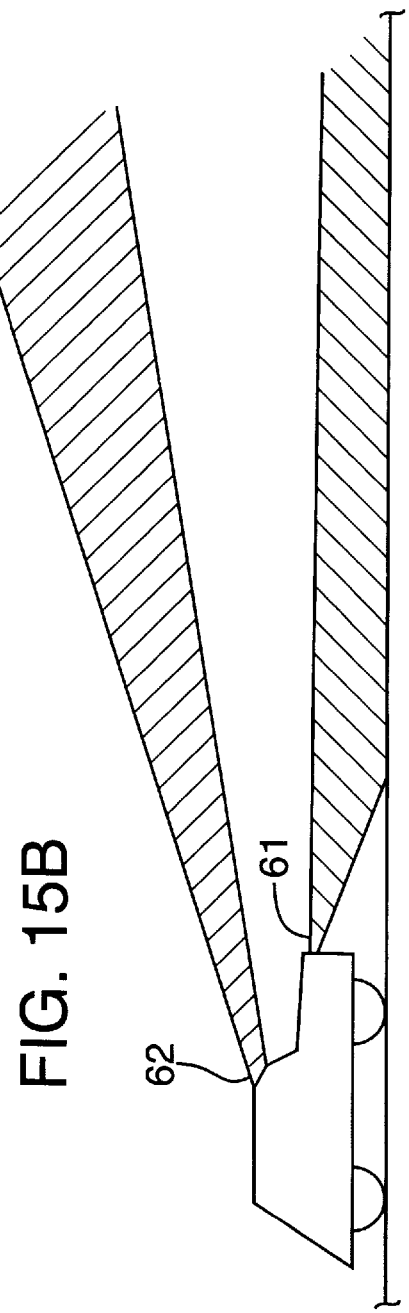

SYSTEM FOR COLLIMATING AND CONCENTRATING DIRECT AND DIFFUSED RADIATION

PRIORITY CLAIM

This patent application claims priority from U.S. Provisional Application, Ser. No. 60/019,583, filed on Jun. 12, 1996.

BACKGROUND OF THE INVENTION

The design effort leading to the subject invention was motivated by the perceived need for solar assisted heating and cooling systems. The first part of this effort resulted in the development of a Vapor Jet Compressor Pump (VJCP), disclosed in U.S. Pat. No. 5,228,310 (which patent is incorporated herein by reference), which had multiple functions, one of which was to serve as a heat pump motivated by solar produced vapor. In this/present application, the VJCP is motivated by the high temperature vapor produced by the collector's receiver. The heat pumping attribute of the VJCP is then used to pump heat from the collector that normally escapes to the outside environment. The temperature inside the collector resulting from heat losses from the high temperature receiver and the absorption of unfocused rays of light is thus reduced to about 50° F. The consequent lowered temperature difference between the cover and the outside environment reduces the energy loss from the collector. For instance, if the outside temperature is 50° F., the loss to the outside would be zero if reflection back to the outside is neglected.

The energy in the vapor supplying the VJCP, plus the pumped heat, is discharged by the VJCP into the space to be heated at temperatures needed for its economical transfer to room air. As a result of this utilization of the heat normally escaping from a collector, the efficiency of the collector approaches 100%.

In the cooling mode of operation, the VJCP pumps heat from the room to be cooled instead of the collector. Calculations indicate that a 250 ft.$^2$ collector—VJCP combination will produce about 17 ton-hr. of cooling per day in New York state during the cooling season.

SUMMARY OF INVENTION

A novel fixed-position solar collector is disclosed which accepts both diffused and direct solar radiation from all directions the same as a flat-plate collector but, in addition, focuses and concentrates both forms to produce significantly higher temperatures and efficiencies than achieved by conventional collectors.

This performance is partly due to the design of the cover of the collector which preferably consists of striated plastic material and clear glass. The striated material is arranged horizontally across the width of the collector to form small, shallow prismatic slabs over the entire surface. The index of refraction of the slabs alternates between two values so that each horizontal slab is bounded by the alternate index of refraction. Refraction and total internal reflection of the light passing through this arrangement causes a reduction in the divergence of the incident radiation with respect to the normal to the surface of the prismatic slabs.

Additional striated layers are preferably bonded to the first layer to further reduce the divergence. The theoretical divergence between rays exiting from the bottom of the cover is less than one degree. The nearly parallel rays preferably are then focused by optical or fiber optic means or a combination of optical and fiber optic means onto a receiver to form a focal line along the length of the receiver, extending across the collector's width, to produce temperatures and efficiencies significantly greater than can be obtained with conventional flat-plate collectors.

Calculations indicate that the cover, theoretically, can be a small fraction of an inch thick. It is estimated that practical consideration of fabrication tolerances and material homogeneity will cause the cover to be about ½ inch thick.

The focal line alternatively can be reduced to a square area by adding a second array of prismatic slab layers to the first to reduce the azimuthal rays' divergence from the normal to square the concentration factor. These higher concentrations permit the use of fiber optic transmission of energy to locations remote from the collector, and also the use of photovoltaic or thermoelectric direct conversion to produce about 16 kilowatt-hours per day of electric energy from a 250 ft.$^2$ collector simultaneously with the production of thermal energy for space heating or cooling. Calculations indicate that light falling on one square foot of the fiber optic acceptor surface can be introduced into a fiber optic cable less than 0.0182 inches in diameter. In the thermoelectric application, the heat rejected at the thermoelectric cold junctions is at temperatures sufficient for heating or cooling space, hence the electricity is a bonus as a result of the availability of additional energy at high temperatures. Electricity produced by the renewable, non-polluting solar energy source, instead of by the combustion of fossil fuel, eliminates an objection to the use of electric motor vehicles. The generated electrical power also can be used for system fans and circulating pumps to make the system completely self-energized for use in remote areas.

The cover of the solar collector of this invention preferably can accept light rays in an angle of incidence range of about 0–80 degrees to the normal of its surface. The rays are emitted from the bottom surface in a rectangular beam having a total divergence of less than 4 degrees with respect to the short side of the rectangle. The substitution of this cover material for the lens on existing motor vehicle headlights is shown to reduce or essentially eliminate the hazardous temporary blinding caused by approaching vehicles during night driving.

OBJECTIVES

The objectives of the inventions described in this specification include:

1. To focus the direct solar radiation from nearly all solar altitudes and azimuths with a fixed positioned solar collector.

2. To focus most of the diffused radiation from all directions that pass through an imaginary hemispheric envelope over the collector.

3. To provide solar energy at temperatures greater than 1000° F. at an outside temperature as low as 32° F.

4. To provide direct conversion of solar energy to electricity.

5. To provide thermal energy for heating and cooling as a by-product of the direct conversion process.

6. To provide a solar-assisted heating system.

7. To provide a solar-assisted cooling system.

8. To provide for the transmission of solar energy through use of fiber optics techniques.

9. To increase fiber optic acceptance angles compared to existing acceptors.

10. To provide steam for operating a vapor-jet heat pump.

11. To use the steam-jet heat pump to pump low temperature heat normally escaping from conventional collectors in the winter to higher temperatures for space heating.

12. To use the heat pump to lower the temperature in the collector to reduce the thermal loss to the outside.

13. To produce overall collector efficiencies greater than 90% in an outside temperature of 32° F. as a consequence of pumping heat from the lower temperature, compared to conventional flat-plate collectors producing temperatures less than 150° F. at efficiencies of 35%.

14. To use the focused heat collected at high temperatures to supply the vapor-jet heat pump to pump the low temperature heat normally escaping from the collector so that the combined heat flow is useful for heating space at more than 90% collector efficiency.

15. To provide heat energy for supplying the vapor-jet pump for cooling space in the summer.

16. To provide a unique design that minimizes the increase in entropy during the energy exchange from solar to thermal energy.

17. To reduce the dependency between collector efficiency and its positioning to increase architectural options.

18. To provide a self energized heating and cooling system completely independent of outside energy sources other than solar.

19: For the above objectives that relate to the collection of solar radiation, to achieve such objectives using a non-moving collector fixed in one position.

20. To produce a light beam essentially invisible in all regions outside the boundaries of the sharply defined beam of low divergence.

21. To achieve these objectives using optical materials having indices of refraction of ordinary plastic and glass.

BRIEF DESCRIPTION OF DRAWINGS

FIG. 1 is a perspective, schematic view of a section of an embodiment of a prismatic slab assembly.

FIGS. 2A–2C are each an end, schematic view of a section of an embodiment of a prismatic slab assembly.

FIG. 5 is a schematic, cross sectional view of an embodiment of a concentrating system.

FIG. 6A is a schematic, cross sectional view of a lens and light funnel portion of an embodiment of a concentrating system.

FIG. 6B is an exploded portion of the light funnel of FIG. 6A.

FIG. 6C is a schematic perspective view of the curved lens depicted in FIG. 6A.

FIG. 6D is a schematic, side view of the lens depicted in FIG. 6A.

FIG. 6E is a schematic end view of another embodiment of the concentration system.

FIG. 8A is a schematic view of an embodiment of the concentrating system for heating and/or cooling of space.

FIG. 8B is a schematic view of an embodiment of the concentrating system for heating and/or cooling of space, and for steam and electrical power.

FIG. 8C is a schematic view of an embodiment of the concentrating system for fiberoptic transmission of energy.

FIG. 8D is a schematic view of an embodiment of the concentrating system for headlights.

FIG. 9A is a schematic side view of an embodiment of a receiver.

FIG. 9B a cross-sectional view, along line A—A of FIG. 9A, of the receiver of FIG. 9A, including a portion of an embodiment of a light funnel.

FIG. 10A is a schematic top view of an embodiment of a thermoelectric receiver.

FIG. 10B is a schematic side elevational view of a portion of the thermoelectric receiver of FIG. 10A.

Only two stages are shown on FIG. 9C, however, the module may consist of as many stages in thermal series as needed for achieving a uniform efficiency near its maximum possible value.

Figure 12:
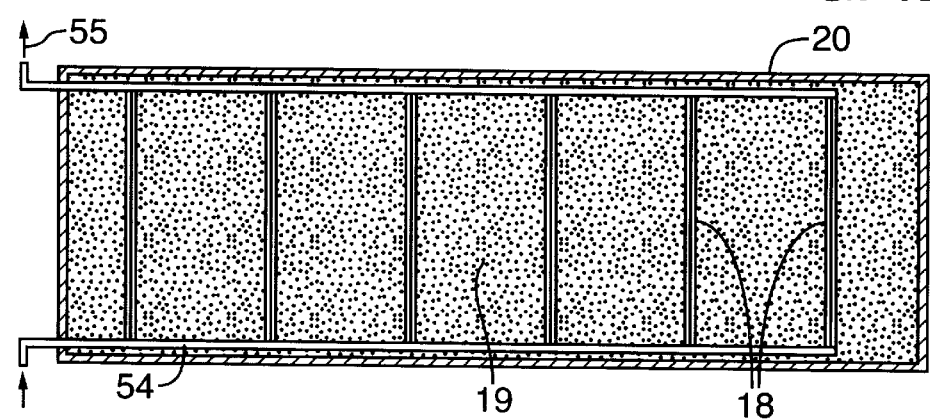

FIG. 12 is a schematic top view of an embodiment of a concentrating collector assembly.

Figure 13:
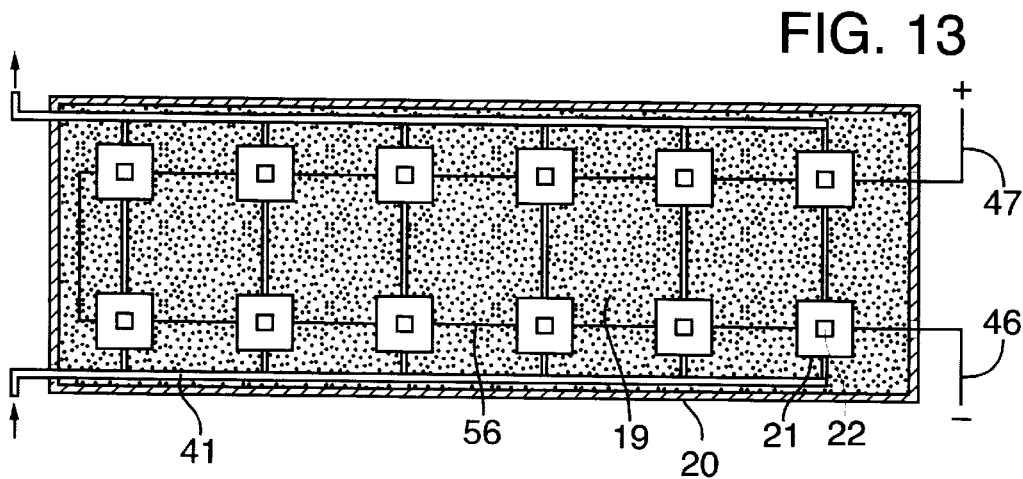

FIG. 13 is a schematic top view of another embodiment of a concentrating collector assembly.

FIG. 14 is a schematic side elevational view of an embodiment of the vehicle headlight embodiment of the concentrating system.

FIG. 15A is a schematic top cross-sectional view of an embodiment of the vehicle headlight embodiment of the concentrating system.

FIG. 15B is a schematic side elevational view of an embodiment of the vehicle headlight embodiment of the concentrating system.

DESCRIPTION OF SOME EMBODIMENTS OF INVENTION

DESIGN SUMMARY

With respect to FIGS. 1 to 15, the principal components of some embodiments of the invention are described below. For convenience of description, it is assumed that the radiation source is disposed generally above the collector, unless otherwise noted.

Figure 3:
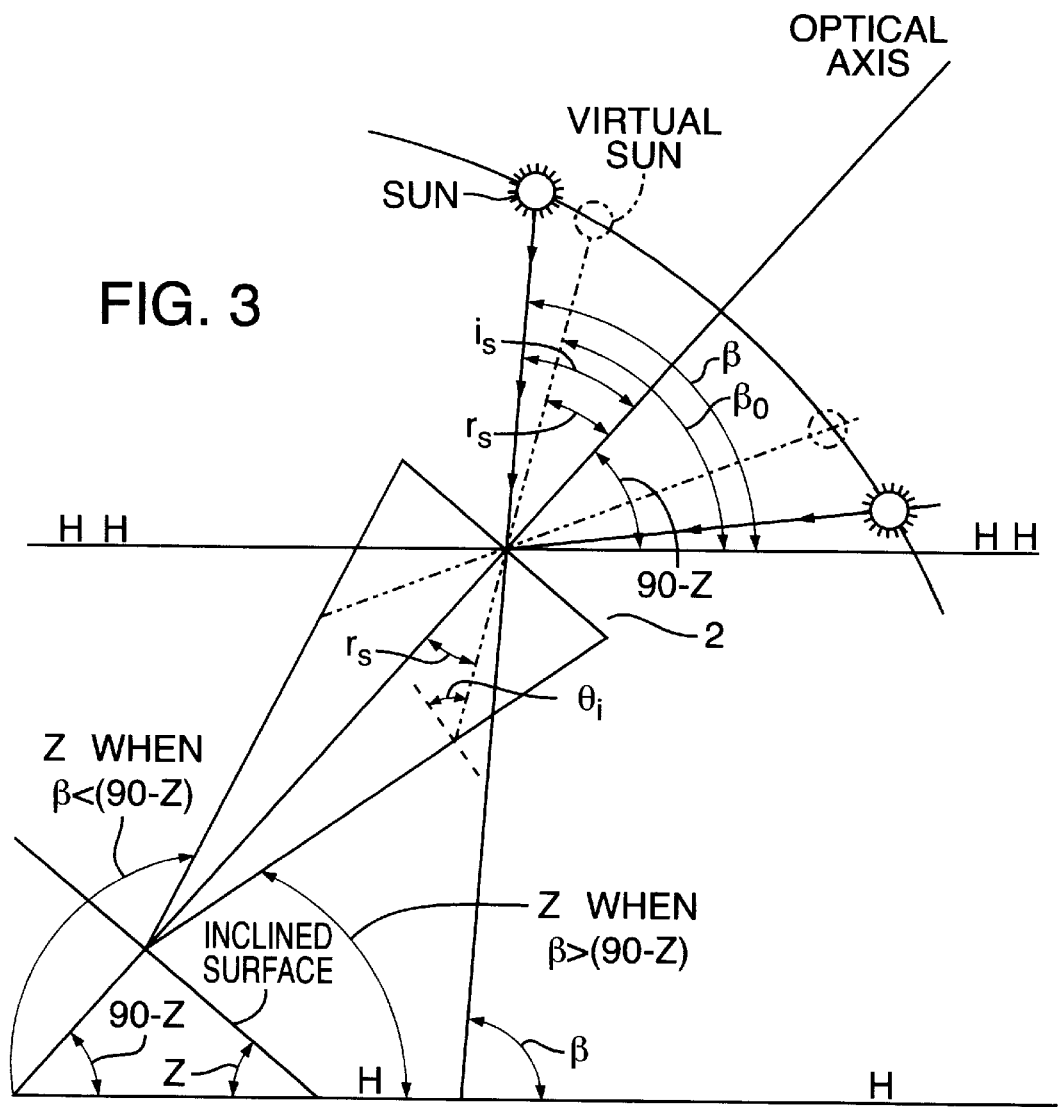
FIG. 3 is an end, schematic view of a converging prism acceptor.

Referring to FIGS. 1, 2, 3, 8A, a prism slab assembly 1 includes a number of alternating and adjacent converging prisms 2 and diverging prisms 3. In this embodiment, each prism slab's longitudinal axis is parallel to the shortest side (width) of collector 20. Each diverging prism 3 has a first side 5 in contact with a converging prism 2, and a second side 4 in contact with another converging prism 2. The index of refraction of each converging prism 2 is 1.3. The index of refraction of each diverging prism 3 is 1.4. FIGS. 2–3 depict the expected path of selected incident rays of radiation, showing the manner in which the prism slab assembly acts to collect and concentrate such incident radiation. Per FIG. 2B, preferably five layers of prism slabs are bonded together to form a collimator, one above the other, randomly aligned. Per FIG. 2C, an alternative arrangement alternates the longitudinal axis of each descending layer by 90°. FIG. 8A depicts the prism slab assembly 1 forming an outer collimator 7 as part of collector 20. Assembly 1 preferably is covered by a glass plate above it.

Figure 4A:
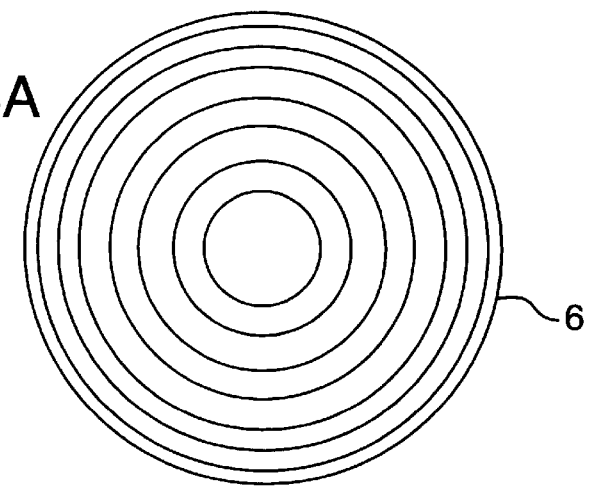
FIG. 4A is a top, schematic view of an embodiment of a thin plastic lens.
Figure 4B:
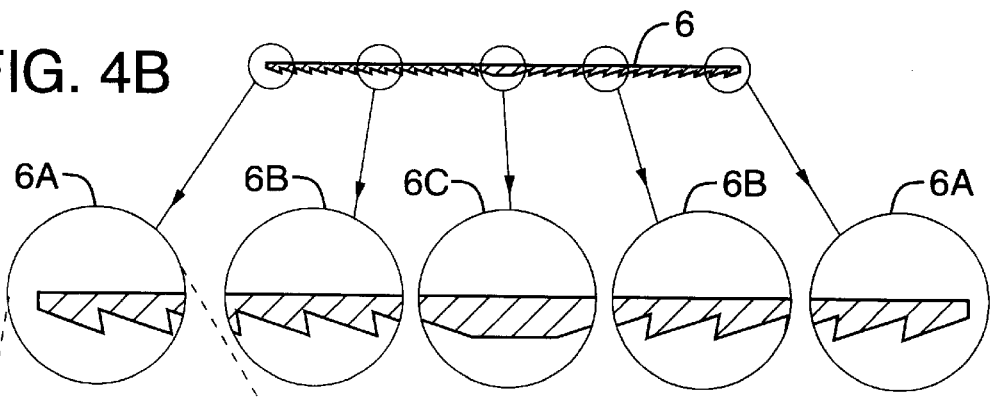
FIG. 4B shows a cross sectional view through the center point of the lens of FIG. 4A, and five exploded portions of such view.
Figure 4C:
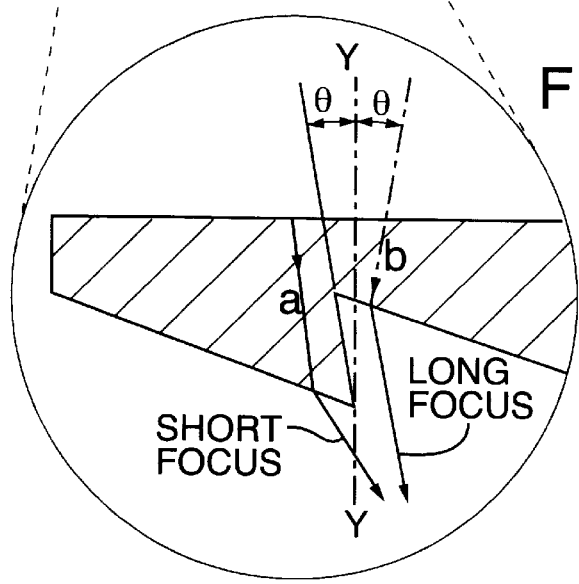
FIG. 4C is a further exploded cross sectional view through the left-most portion of FIG. 4B.

Referring to FIGS. 4A–4C, and 5, one embodiment of a lens is shown. An outer flat plastic lens 6 comprises a series of circular grooves. The index of refraction of the lens is 1.7. As seen in FIG. 4B, the most outwardly extending grooves 6A are cut steeper than are the intermediate grooves 6B, while the center 6A of the flat plastic lens 6 is substantially flat such that its lower surface is parallel to its upper surface. FIG. 4C depicts the passage of two selected rays of radiation through a portion of grooves 6A. As shown in FIG. 5, the outer flat plastic lens 8 is disposed on the inside of the outer collimator 7. Together, they serve to collect and concentrate radiation incident on collector 20.

Figure 7A:
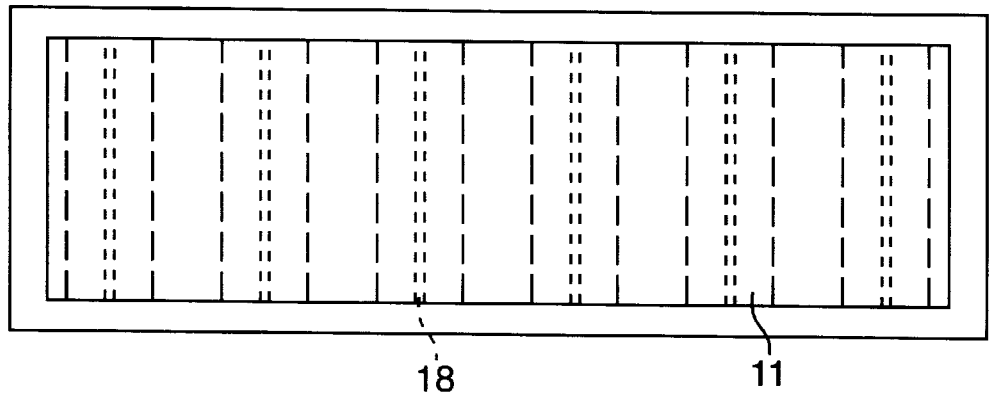
FIG. 7A is a schematic, top view of an embodiment of a collector.
Figure 7B:
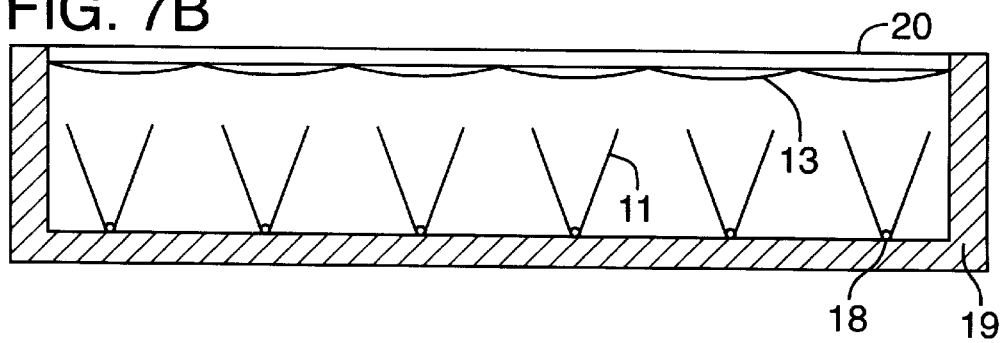
FIG. 7B is a schematic, side cross-sectional view of the embodiment of FIG. 7A.

Referring to FIGS. 6A–6B, 7B, 7C, and 8A–8C, an alternative embodiment of lens is shown. Curved lens 13 is disposed inside of outer collimator 7. Each lens' longitudinal axis is parallel to the shortest side (width) of collector 20. As shown in FIG. 7B, each lens is disposed above a light funnel 11 so that it may concentrate incident radiation into said light funnel. The light funnel 11 in turn further concentrates the incident radiation onto the receiver 18 disposed beneath it. Light funnel 11, in the "slab" embodiment of FIGS. 6A–6B, 7B, and 9B, is generally shaped as a V-shaped trough, with inner tapered walls 14 and outer tapered walls 15 extending along the width of the collector 20. Each wall 14 extends from a top edge 17, closest to the collector's cover, to a bottom portion 16, closest to receiver 18. As shown in FIG. 6B, the wall 14 profile is shaped so as to maximize the $i_2$ angle of incidence. The ray shown trapped within side wall 14 in FIG. 6B is the worst case situation. The concentration factor of the arrangement of FIG. 6A is calculated to be greater than 27. In FIG. 6A, the shaded rays represent the divergence from a few typical points of an infinite number of points on the lens 13. The outer portions of the rays represent worst-case conditions.

Acceptor—The acceptor is the first (or top) prismatic layer 1, closest to the source of incident radiation. The acceptor receives the solar radiation, reduces its divergence, and transmits it to prismatic layers below for further reduction in divergence in the North-South direction. The Acceptor preferably is in the form of a prismatic slab 1, FIGS. 1–2, which reduces the divergence of the incident solar radiation in both the North-South and East-West (Azimuthal) directions by means of refraction.

Prismatic Layers—These layers are one or more prismatic layers adjacent the Acceptor preferably having the same structure as the Acceptor, as shown in FIGS. 2B–2C. In the FIG. 2B embodiment, these layers reduce the divergence of the radiation in the North-South direction to a minimum practical value, but do not change the divergence in the azimuthal direction which remains the same as received from the Acceptor.

Lens—The lens, 13 or 8, focuses the nearly parallel North-South radiation emanating from the bottom of the last prismatic layer to form a horizontal focal line in the East-West azimuthal direction. The divergence of the North-South radiation from the vertical axis has essentially an infinite number of values between the worst-case maximum range, $\pm\theta_2$ Table III, therefore, the horizontal focal line has a width through which all the radiation passes as seen on the end view of FIG. 6D. A flat plastic grooved sheet, e.g., 1/16 inch thick, or circular prismatic slabs, may be substituted for the lens shown in FIGS. 7, 14.

Light-Funnel—Fiber optic techniques are used to reduce the minimum focal area produced by the lens to achieve a greater concentration of radiation. The radiation having the longer focal lengths in the focal plane is entrapped in the tapered walls of a glass funnel 11 that extends the width of the collector and above the minimum focal area of FIG. 6D. The tapered glass walls converge to a focal area near the short focal length to concentrate all the entrapped radiation into a small area, as indicated on FIG. 6A to produce a concentration factor (acceptor area/focal area) of about 27. Alternatively, the light funnel may be provided with a cylindrical base as shown in FIG. 6E, and discussed below.

Receiver—FIGS. 9A, 9B and 12 illustrate the receiver 18 which absorbs concentrated radiation to produce relatively higher temperatures in the medium in the tubes used to transfer the heat from the receiver to the point of use. FIGS. 7A–7B depict the assembled parts.

Figure 7C:
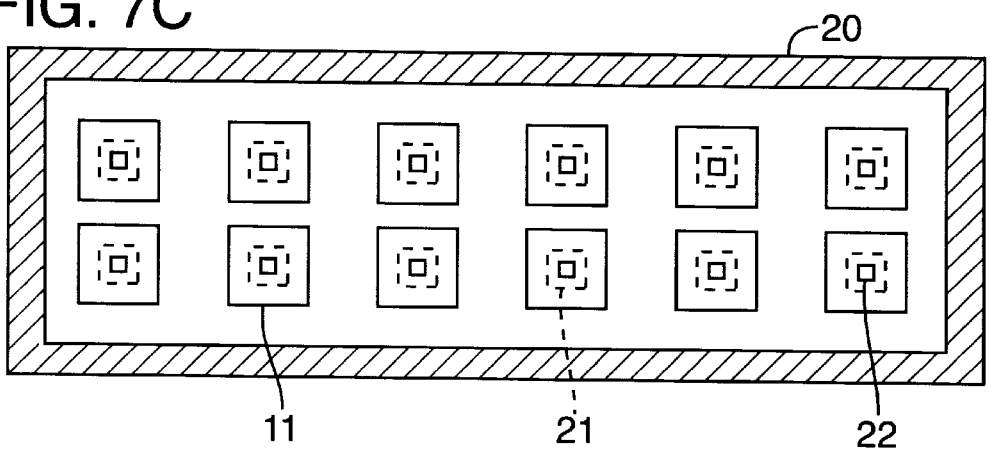
FIG. 7C is a schematic, top view of another embodiment of a collector.
Figure 11:
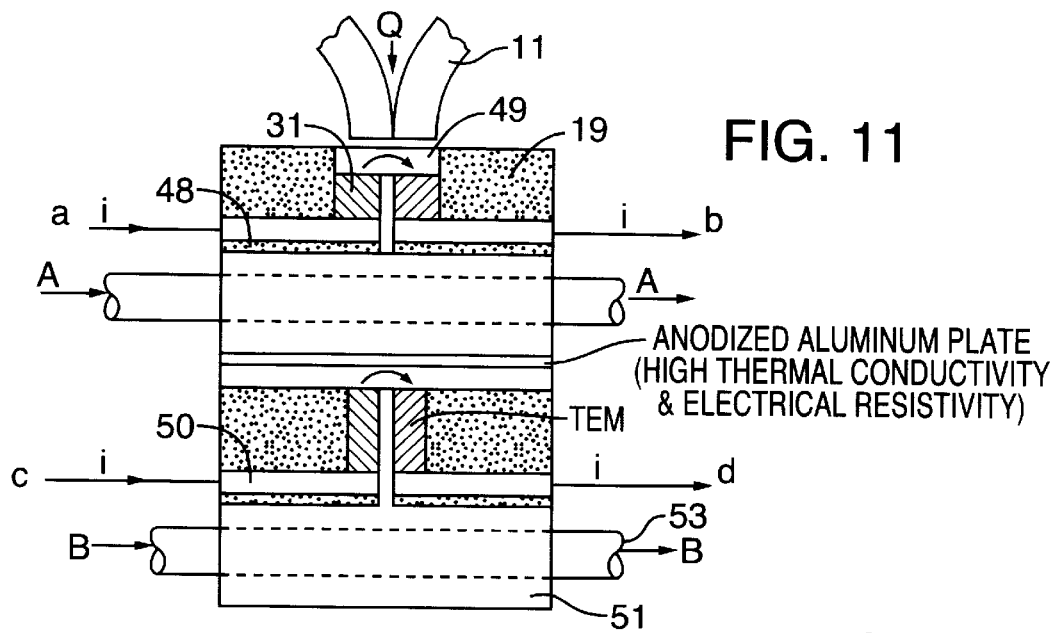
FIG. 11 is a schematic side cross sectional view of a portion of another embodiment of thermoelectric receiver. The design shown on FIG. 11 provides means for increasing the thermal resistance of the conducting path in contrast to the FIG. 9B design to produce nearly maximum efficiency at all solar heat inputs. For instance if Q decreases significantly the associated reduction in the output of the TEG is sensed by a conventional microprocessor system (not shown) which switches the cooling fluid from tube A—A to tube B—B. The cold junction for the first stage then becomes the hot junction for the second stage the cold junction of which is now cooled by tube B—B. The added thermal resistance of the second stage then returns $T_h$ to near its maximum allowable value to restore TEG efficiency to near its maximal value. The electrical circuit is changed at the same time as the cooling circuit so that b is connected to c and the output of the module is available at terminal d.

FIGS. 10A, 11 and 13 illustrate receivers designed to accept radiation that is concentrated both in the North-South direction and the East-West azimuthal direction. The receiver includes a thermoelectric generator 30 which can extract electrical power as a result of the high temperatures associated with the concentrated radiation and reject heat at temperatures adequate for energizing a steam-jet heat pump for use in heating and cooling space. FIG. 7C depicts the assembled parts.

APPLICATIONS

With reference particularly to FIGS. 8A to 8D, some applications of some embodiments of the inventions are described below.

I. Heat Pump

1. Heating of Space

U.S. Pat. No. 5,228,310 (incorporated herein by reference) describes a special heat pump designed to operate with a low pressure vapor supply produced by conventional flat-plate solar collectors to improve their overall efficiency. As described in the Background above, the steam-jet heat pump serves the same function in the collector disclosed in this specification. The steam-jet heat pump is called the Vapor-Jet Compressor Pump (VJCP) because, in addition to functioning as a heat pump, it also compresses and condenses vapor produced at low temperatures and discharges the compressed and condensed vapor, now at elevated temperatures, into the space to be heated. In addition, the residual kinetic energy in the compressed vapor and the motivating steam is used to impact the cooled water returning from the room air heating system to circulate the heated water through the system. The VJCP is designed with dual nozzles. One nozzle is connected to the steam supply generated by the solar collector and the other to a steam furnace. Therefore, space heating can be provided from one source or the other or both simultaneously. The heat delivered by the solar source (Q in Btu/ft²/hr) is listed on IDS Table I. Applications are illustrated in FIGS. 8A–8B.

2. Cooling of Space

In the heating mode of operation, the VJCP heat pump section is used to pump heat at low temperatures normally escaping from the collector to higher temperatures for heating space. Thus the collector efficiency approaches 100%. In the cooling mode of operation, the heat pump section is connected to the room air heating/cooling system so as to similarly pump heat from the room air. The collector described in this disclosure, in contrast to the collector of U.S. Pat. No. 5,228,310, can produce vapor at high temperatures and pressures because of the intense concentration of radiation on a small area. As a result, the cooling capacity of the disclosed system is increased significantly.

IDS Sketch 6 depicts the cooling performance of conventional steam-jet heat pumps. The lower curve indicates the pounds (mass) of steam required to produce a one ton rate of cooling by evaporating water at 50° F. and circulating the chilled water resulting from the evaporation through room coolers to absorb heat from the room. The curve at the upper right of Sketch 6 provides a multiplier which is a penalty on performance caused by low steam pressures. For example, a motive steam pressure of 30 psia has an associated value for the multiplier of about 1.55 and if the discharge water from the VJCP is 101° F. the amount of steam required for a one ton rate of refrigeration becomes 21.5×1.55=33.3 lb/hr. At a VJCP discharge temperature of 101° F. and a motive steam pressure of 100 psia (85 psig), only 22.5 lbs. (mass) of steam per hr. are needed to produce a ton cooling rate. From IDS Table I, on Jul. 21 in the middle of the cooling season in New York State, the total heat available is $Q_1$=1900 Btu/ft² of collector per day (from symmetry, May 21st is the same as Jul. 21st). The 1900 Btu is reduced by a clearness factor, which reportedly is essentially unity, and by collector efficiency. In the summer, the heat normally pumped from the collector by the VJCP is used instead to heat a hot water supply, hence the collector efficiency for producing steam is estimated to be about $0.9Q_1$.

The collected heat is approximately 0.9×1900=1710 Btu/ft.² day. The amount of heat needed to generate 1 lb. (mass) of steam is 1118 Btu, hence the total Btu required to provide a ton rate of cooling becomes 22.5×1118=25,155 Btu. Total cooling provided by a 250 ft.² collector (less than the floor space of an average living room) is 250×1710/25,155=17 ton-hr. or 204,000 Btu/day. This is an average rate from 6 AM to 6 PM, on Jul. 21st, of 1.42 tons or, in a Btu rating, 17,000 Btu/hr.

II. Direct Conversion

FIGS. 10A–10B depict a thermoelectric generator 30 designed to be heated by concentrated radiation on its hot junction 22 area. The cold junctions 21 are cooled by the same coolant channels and coolant that produce motive steam for the VJCP.

The efficiency of thermoelectric generators is related to the Carnot Cycle efficiency, $(T_h-T_c)/T_h$, where $T_h$ and $T_c$ are respectively the absolute temperatures of the hot and cold junctions. The calculated performance in this specification is based on a hot junction design temperature of 1100° F. (1560° F. absolute) and cold junction temperatures of either 100° F. or 328° F. (560° F. and 788° F. absolute). The efficiency of converting thermal to electrical energy is assumed to be 15% when the cold junction is at 100° F., hence it is reduced to 11.6% when the cold junction temperature is increased to 328° F. in accordance with its relation to the Carnot Cycle efficiency. The 328° F. cold junction temperature is used when it is desirable to generate both high temperature steam and thermoelectricity simultaneously. Control of the temperature is achieved by controlling the rate of coolant flow.

Calculated performance data listed on IDS Table IV relate to a 250 ft.² solar collector confined in a fixed south-facing position with its irradiated surface inclined 40° to a horizontal plane. The collector is located in and subjected to the environmental conditions existing in Albany, N.Y. Data is presented for each month of the year and gives the performance when the system is operated solely to produce either the heating of space, cooling of space, or the generation of electrical power. Data are also given for system performance when simultaneously providing heating of space and the generation of electricity and for the cooling of space plus the production of electricity. When the system is operated to produce electrical power only, it generates on the average about 19 kilowatt hours per day, enough to power a small 20 horsepower vehicle on neighborhood trips for more than an hour each day. Reportedly, 95% of the time motor vehicles are driven, the trip length is less than 8.3 miles. This mileage is well within the range of the small 20 horsepower vehicle. Such vehicles powered in this manner with renewable solar energy backed up by utility supplies when necessary results in a significant reduction in air pollution, traffic congestion, dependency on foreign fuels and trade deficits.

The generated electrical power can also be used to supply system fan and pump motors to attain complete system self-sufficiency for use in remote or undeveloped regions where electrical power is not available.

When thermoelectric power is generated simultaneously with the space heating or cooling functions, it is reduced to about 14 kw-hr. per day. If this electrical power production is not adequate, it can be supplemented with utility power in developed areas. A compromise between cooling demands and the need for electrical power can be easily accomplished by regulating the temperature of cooling water at the cold junctions. In this case, the thermoelectricity is a bonus resulting from the availability of more energy from the same quantity of heat at the high hot junction temperatures.

The generation of electrical power by direct conversion from solar radiation to electricity is shown to be sufficient and practical for powering small electric vehicles for neighborhood use thus avoiding a large percentage of existing air pollution, non-renewable fuel consumption and traffic congestion resulting from current practices.

III. Energy Storage

A negative aspect of solar energy has always been the heat storage problem when excess energy from the collectors is available during peak periods of collection. The electrical storage of energy as described in this specification avoids the wasting of the solar energy or the need to have bulky storage facilities.

IV. World-Wide Use—Self-Energized System

The attribute of the system for simultaneously generating electricity while heating or cooling space enables all pumps and fans needed for the circulating of the heat transfer medium and heat rejection to be powered by the generated thermoelectricity. Hence, the system can operate independently of any other outside source of energy.

The self-energized system can be used in remote regions to improve the quality of life of those who otherwise do not have the advantages provided by readily available electrical power.

V. Steam Driven Apparatus and Process

There are a large number of additional applications that require high temperature energy that can be supplied by the collector, such as the use of process steam and steam for driving apparatus, turbines, etc.

VI. Lighting—Non-Blinding Motor Vehicle Headlights

Objective 20, stated above, relates to the prismatic layers of this invention. These layers are used to produce a light beam having a divergence of $\theta_2$ in accordance with Equation (9). Because the only light emanating from the prisms is confined in a beam having a divergence of $\theta_2$, the light source is uniquely invisible outside the beam boundaries (7). Therefore, an observer viewing the illuminated area from outside the beam's boundaries will not be blinded by the source of the beam as occurs in existing lighting. This aspect of the invention applies to all types of lighting such as motor vehicle headlights, street lights, flood lights, flashlights, stage lights etc.

Application Example—Automobile Headlights—With reference to FIG. 15A, existing headlights consist of a parabolic reflector 36 having a lamp 59 located near the focal point of the reflector. Because of the size of the incandescent filament of the lamp, it cannot be located exactly at the focal point, hence the reflected light diverges at undesirably large angles. A purpose of the glass lens covering the reflector is to refract some of this light downward; however, the remaining light often blinds the approaching driver causing a well-known hazard in night driving. The dimmer switch orients the light source to cause a greater portion of the light not at the focal point to be cast downward below the eyes of the approaching driver, however, the parabolic surfaces and the lens remain brightly illuminated to again cause blinding. The replacement of the lens of existing headlights with a prismatic cover 57 of this invention will essentially eliminate the night blinding hazard because the light source and the reflector and lens are not visible by definition since all the internally reflected light in the diverging prisms is confined to an angle of divergence, $\theta_2$.

FIG. 14 illustrates motor vehicle headlight performance provided by the prismatic cover 57. Three elemental beams of a continuous series of horizontal prismatic beams that produce a uniform beam from the entire surface of the headlight are shown.

Figure 14A:
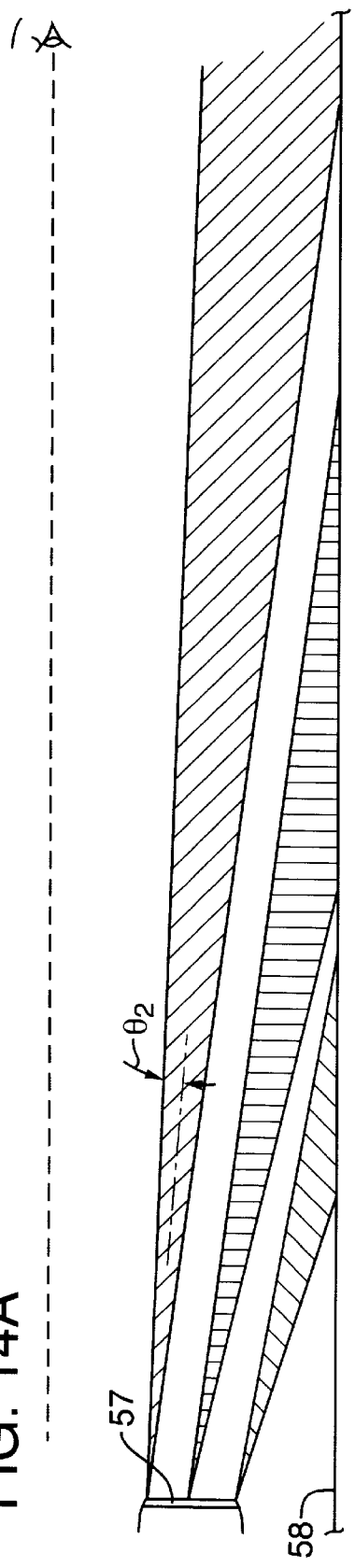

FIG. 14A depicts the lighting of a level road with prismatic beams having a divergence of $\theta_2$. the upper elemental beam emanates from the prisms at the top of the headlight to serve the function of high beams of conventional headlights. The bottom beams are arranged to light the nearer foreground. The horizontal prismatic slabs can be arranged, for instance, by bending the cover into a curve so that the light from each slab progressively lowers the beam angles between the top and bottom extremes to flood the road ahead uniformly with light. The upper boundary of the top beam is shown to be below the eyes of the approaching driver, hence the driver will not see the internally reflected light from the prisms (7) but can see the light reflected from the road to alleviate an obvious existing hazard. The system also allows the use of the high beams at all times because the road can be illuminated for a considerable distance without blinding the driver in the approaching vehicle.

Figure 14B:
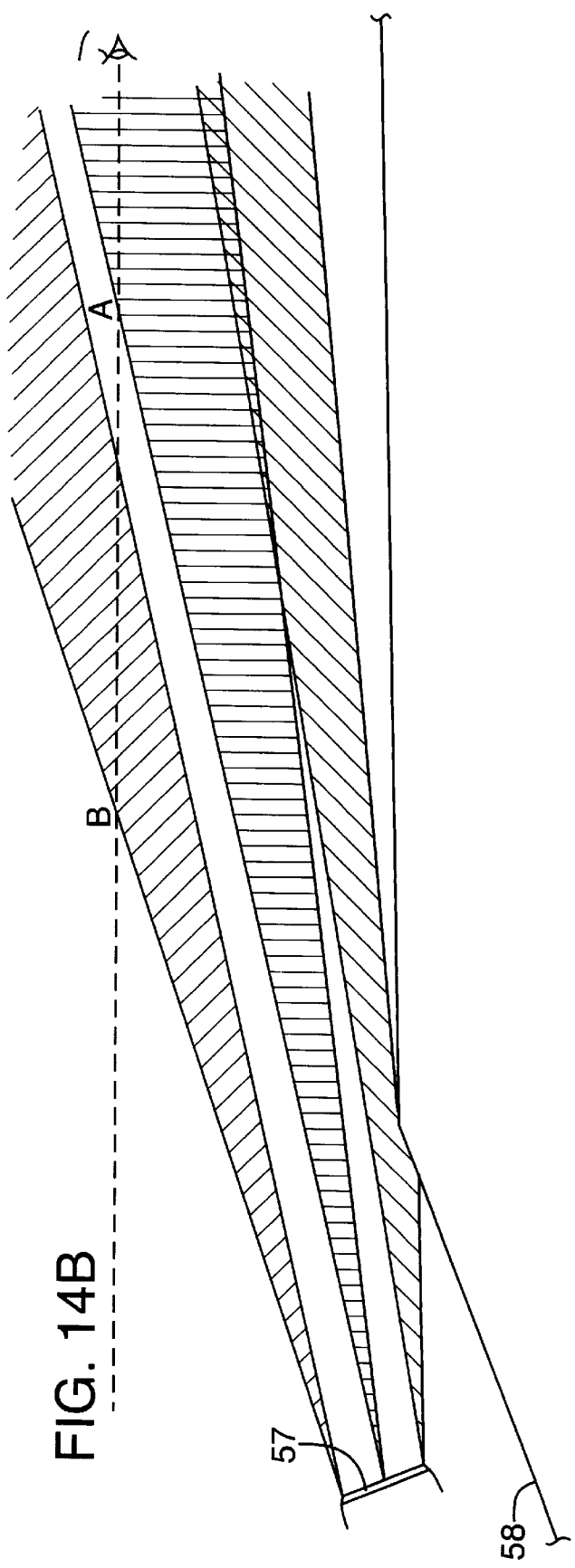

FIG. 14B illustrates a worst-case situation when the beams from the headlights of a vehicle going up a hill are tilted upward as it approaches an on-coming driver. In this case the light is shown to be entering the eye of the driver from beams emanating from near the middle of the headlight, the lower part of the headlight will be dark. As the driver on the right reaches point "A" only one half of the headlight will appear to be illuminated and at point "B" the entire headlight will be darkened. The overall effect will be a gradually darkening headlight as the vehicles approach each other and before they pass the headlights will be completely darkened. The road, however, will be illuminated by the vehicle on the right to make it visible to both drivers.

Completely invisible headlights would obviously present another hazard, however, prismatic slabs can be designed to cause some of the light from the source to escape total internal reflection to pass laterally through the prismatic slabs and exit from the bottom of the diverging prisms at larger angles of divergence. This radiation would be visible at all times. If the light source emits light at various wavelengths it is possible that the lateral passage through the prisms may disperse the light resulting in a distinctive rainbow appearance. The beams shown on FIG. 14A will not illuminate road signs above the vehicle on the side of the road or overhead. Two options for making these signs visible are:

1) Increase the light rays that pass laterally through the prismatic slabs. This is accomplished by the addition of a light source 60 at the periphery of the prismatic cover 57, FIG. 15A. Light rays from these locations have the large angle of incidence required to escape internal reflection. Therefore, when the peripheral lights are turned on, the highly divergent beams from the headlights will increase in intensity sufficiently to illuminate the signs.

2) Locate prismatic lights near the top of the vehicle above the eyes of approaching drivers, as depicted in FIG. 15B. The light is beamed upward to illuminate signs either overhead or at the side of the road. It should be noted that though the beam is confined to a divergence of $\theta_2$ in a vertical direction, the horizontal slab geometry does not confine the divergence in a horizontal direction, hence the beam will cover all the signs across a normal highway.

VII. Fiber Optics Energy Transmission

1. Acceptor

The combination of the prismatic cover, lens and light funnel of this invention comprises a fiber optic acceptor. The device accepts radiation in a 0–80 degree range from all directions and concentrates it by a factor of 744 on to the thermoelectric receiver. If a second similar acceptor system is substituted for the thermoelectric receiver, the radiation would be concentrated by another factor of 744 to yield an area of concentration of approximately 0.0003 inches. Assuming this to be a circular area, it would have a diameter of 0.0182 inches which would be the diameter of the base of the second light funnel.

2. Energy Transmission

Instead of using the light from the base 16 of the light funnel 11 to heat a thermoelectric hot junction, FIG. 10B, the light funnel is attached to a fiber optic cable having a large confining angle, FIG. 8C. Hence, neglecting light absorption in the acceptor material, the energy collected by one square foot of collector surface can be transmitted to a remote region by a fiber optic cable that is 0.0182 inches in diameter.

DETAILED ANALYSES

Detailed analyses and calculations are relied upon to establish and confirm the performance claimed for the collector. Uncertainties in the analytical approach with regard to the three dimensional aspect of solar radiation on prism surfaces were eliminated by tests. The remainder of the analyses and calculations are based on the routine use of accepted optical laws and principles. Therefore, it is believed that the calculated results correctly predict performance.

Methods for fabricating the prismatic layers and associated difficulties have not been investigated. Fabrication feasibility is discussed below.

To reduce calculational detail, a list of optical laws and axioms is in the Glossary below and referred to by numbered superscripts in the text from time to time to clarify the calculations. Symbols are defined below and also as they are introduced in the text. Explanatory sketches are submitted in an Appendix filed with the Patent Office as an Information Disclosure Statement.

A particular set of conditions was assumed for the calculations. A parametric study is required in which the variables are changed in order to determine maximal performance.

The indices of refraction used in the calculations are limited to those values found in ordinary glass and plastic materials.

NOTATION

A=Prism Line-up Factor—dimensionless
$\beta$=Sun's Actual Altitude—degrees
$\beta_0$=Sun's Virtual Altitude—degrees
$d_1$=Width of prism at point of entry of solar ray—inches
$d_2$=Width of prism at bottom—inches
i=Angle of Incidence; $i_1$=incidence on side #1 (5) of converging prism #1
$i_2$=incidence on side #2 (4) (diverging prism $i_s$=solar incidence)
Q=Solar Heat Intensity—Btu/hr/ft$^2$
r=Angle of refraction; $r_1$=refraction from side #1 (5) (converging prism)
$r_2$=refraction from side #2 (4) (diverging prism);
$r_v$=refracted angle with the vertical axis; $r_s$=refraction of solar beam
n=Index of Refraction; $n_1$ (air)=1; $n_2$=converging prism (prism #1);
$n_3$=diverging prism (prism #2); $n_4$=Lens and Light Funnel Index
Crit=Critical Angle
Z=Inclination of collector surface to horizontal;
$Z_0$=Inclination of Prism (Eq. 2)—degrees

GREEK $\beta$=Altitude; $\Phi$=Azimuth; $\theta$=Angle; $\theta_t$=Angle of tapered side of prism with its vertical axis; $\theta_3$=Incident angle on side #1 of a prism #1;
$\Sigma$=Eq.#1, Inclination of collector surface—degrees
Note: Additional symbols are identified in the derivation on sketch 6.

Outline of Analysis and Calculations

1. Solar Acceptor Prisms—First Prismatic Layer
   a) Stab Geometry-Angles of Incidence, Refraction & the Critical Angle
2. Three Dimensional Analyses
   a) ASHRAE Equation
   b) Revised ASHRAE equation for determining Angle of Incidence $\theta_3$ on tapered side of prism #1.
   c) Calculation of Virtual Altitude of the sun
      1) When the sun's altitude is above the Optical Axis, FIG. 3
      2) When the sun's altitude is below the Optical Axis, FIG. 3
   d) Calculation of the Virtual Azimuth of the sun
   e) Calculation of the Angle of Inclination, $Z_0$, of the sides of Prism #1
      1) When the sun's altitude is above the Optical Axis, FIG. 3
      2) When the sun's altitude is below the Optical Axis, FIG. 3
   f) Calculation of the Angle of Incidence $\theta_3$ on the tapered sides of Prism #1
   g) Test determination of the Angle of Incidence $\theta_3$ and correlation with the calculated value
3. Performance Calculations
   a) Line-up between prismatic layers
   b) Worst-case solar altitude
   c) Line-up used in illustrative calculations—Factor A
   d) Design Criteria
   e) Second Prismatic Layer—Graphical Method for Determining Angles of Radiation
   f) Second Prismatic Layer—Analytical Method for Determining Angles of Radiation
      1) Calculational Model
      2) Divergence Reduction Equation #9
   g) Calculation of the Reduction in Divergence, $\theta_2$, Produced by the Prismatic Layers
4. Concentration of Radiation
   a) Optical
   b) Optical—Fiber optic Combination
   c) Azimuthal
5. Absorption of Concentrated Radiation
   a) Focal Line Receiver
   b) Thermoelectric Receiver
6. Fabrication Feasibility

Analysis and Calculations

1. Solar Acceptor Prism—First Prismatic Layer (Introductory Calculations)

a) Slab Geometry and the Angles of Incidence, Refraction and the Critical Angle.

FIG. 2A is an end view of four horizontal slabs. Solar rays, $i_s$, are shown entering the top surface at an angle of incidence, $i_s$, between a perpendicular to the surface and the beams. The beams are refracted at an angle of $r_s$ to the perpendicular where $$r_s = \sin^{-1} \times \left(\sin i_s \times \frac{n_1}{n_2}\right) \text{ degrees} \tag{4a}$$

and where $n_1$ is the index of refraction of air=1 and $n_2$ is the index of refraction of the accepting prism material which is assumed to be 1.3. Assigning an arbitrary value for $i_s$ of 80° and evaluating:
$r_s$=49.25°

From the geometry of FIG. 2A, the angle of incidence with the side of the converging acceptor prism, referred to subsequently as prism #1 is:
$i_1$=90−($r_s$+$\theta_t$)
for a prism taper angle, $\theta_t$=5°
$i_1$=35.75°
and the refracted angle from side 1 of prism #1 for $n_3$=1.4 becomes
$r_1$=sin$^{-1}$(sin $i_1$×$n_2$/$n_3$)=32.86.

As refracted $r_1$ traverses the diverging prism, henceforth referred to as prism #2, it contacts the side of prism #2 at an incident angle: $i_2=r_1+2\theta_t=42.86°$ (10).

The critical angle at side 2, $Crit=\sin^{-1}n_2/n_3=68.21$ (5). Angle $i_2$ is less than Crit, therefore, the ray will pass into the next converging prism. Since the apex of the diverging prisms, which have the highest index of refraction, are at the top of the array, the ray will continue to pass through a series of prisms curving downward (6), FIG. 2B, while the angles of incidence slowly increase. Unfortunately, the ray will probably reach the bottom of the prism array before reaching Crit, hence, will not be trapped in a diverging prism to reduce its divergence with the longitudinal axis, the purpose of the device. At lower incident angles of the solar beam $i_s$, however, the purpose is gained. For instance, if $i_s = 20°$ and using the same calculational procedures:

$i_s = 20°$     $Crit = 68.21$ $r_s = 15.25$ $i_1 = 69.75$ $r_1 = 60.59$ $i_2 = 70.59$ Now $i_2$ is greater than Crit and the ray is totally internally reflected in the diverging prism because as it travels downward its incident angle increases by $2\theta_t$ (10) after each reflection.

This example shows that divergence with the longitudinal axis can be reduced providing angles of incidence, $i_1$, on the surface of prism #1 are large and that indices of refraction are selected that cause the ray to be trapped in prism #2.

2. Three Dimensional Solar Radiation Analyses and Calculations a) ASHRAE Equation The above descriptive example considers only two dimensions, the width and depth of the prisms with sun altitudes of 10 and 70 degrees above the horizon involved with the same dimensions. However, the sun insists on having East-West positions in addition to changes in altitude. The East-West positions introduce a third dimension, an azimuth angle, that must be considered. The azimuth angle $\gamma$ is denoted on sketch 1. Fortunately, the inclusion of the azimuth angle in the analyses results in a desirable increase in the angle of incidence, $i_1$, on the side of prism #1. Hence, a much larger range of solar incident angles can be trapped in the adjacent prism #2.

A reported equation provides an accounting for the azimuth angle written below as Equation (1):

$$\cos \theta = \cos \beta \cos \gamma \sin \Sigma + \cos \beta \sin \Sigma \qquad \text{Eq. 1}$$

where:

$\beta$ is the actual altitude of the sun $\gamma$ is the actual azimuth of the sun $\Sigma$ is the inclination of the collector surface with the horizontal $\theta$ is the angle of incidence resulting from the consideration of $\beta$ $\gamma$ and $\Sigma$.

IDS Sketch 1 relates the symbols to the geometry of the collector. Referring to Sketch 1, a flat-plate collector is shown inclined at an angle $\Sigma$ to the horizontal. Sketch 1 also depicts a position when it does not face directly south. The equation must be revised, however, to account for the conditions introduced by the prismatic slabs to be mounted on the surface of the inclined plane in Sketch 1. These conditions are diagramed on FIG. 3.

b) Revised ASHRAE Equation for Determining Angle of Incidence, $\theta_3$, on Tapered Side of Prism #1.

Equation 2 and the illustrative calculations which follow relate only to a south-facing collector, Sketch 2, in contrast to Sketch 1, to simplify the calculational procedures. To avoid confusion with Equation 1, the revised equation (2) uses different symbols that reflect special conditions for determining the sun's altitude, azimuth and the inclination of the collector surface that are associated with the prismatic collector design. The revised equation is:

$$\theta_3 = \cos^{-1}(\cos \beta_0 \cos \Phi_0 \sin Z_0 + \sin \beta_0 \cos Z_0) \qquad \text{Eq. 2}$$

where:

$\theta_3$ denotes the angle of incidence on the tapered side of prism #1, the boundary between $n_2$ and $n_3$ material $\beta_0$ is the virtual altitude of the sun that would be apparent to an observer in the prism material at an index of refraction of $n_{2=1.3}$ $\Phi_0$ is the virtual azimuth caused by refraction similar to $\beta_0$ $Z_0$ is the inclination with respect to the horizontal of the tapered side of Prism #1.

c) Calculation of the Virtual Altitude of the sun $\beta_0$

1) When the sun's altitude is above the Optical Axis, FIG. 3 $\beta=i_s+(90-Z)$, solving for $i_s$ where Z is the inclination of the inclined surface supporting the prism.

$i_s=\beta+Z-90$ and from (4a)

$r_s=\sin^{-1}(\sin(\beta+Z-90)\times n_1/n_2)$

Also from FIG. 3 geometry $\beta_0=90-Z+r_s$, substituting the term for $r_s$ $$\beta_0=90-Z+\sin^{-1}(\sin(\beta+Z-90)\times n_1/n_2) \qquad \text{Eq. 3}$$

2) When the sun's altitude is below the Optical Axis, FIG. 3

Similarly it can be seen from the geometry of FIG. 3 that $\beta_0=90-Z-r_s$

Substituting for $r_s$ $$\beta_0=90-Z-\sin^{-1}(\sin \beta+Z-90)\times n_1/n_2 \qquad \text{Eq. 4}$$

d) Calculation of the Virtual Azimuth, $\Phi_0$, of the sun

FIG. 1 depicts the length of the prism slab extending across the width of the inclined plane of Sketch 2. The actual solar rays striking the surface of acceptor Prism #1 at an azimuth angle $\gamma$ are refracted similar to the case of the altitude, to reduce the virtual image of the sun to an angle ($\Phi_0$ where $\Phi_0=\sin^{-1}(\sin \gamma \times n_1/n_2)$—Eq. 5 and $\gamma$ is the actual azimuth of the sun used in Equation 1.

e) Calculation of the inclination $Z_0$ of the sides of Prism #1

1. When the sun's Altitude is Above the Optical Axis, FIG. 3

The bottom surface of the prism is irradiated for this condition, however, the irradiation occurs on the side opposite to that shown on Sketch 1. To be consistent with Equation 1, which is based on Sketch 1 geometry, the inclination is considered to be negative and is measured counter-clockwise from the horizontal plane to yield a second expression for $Z_0$ for altitudes above the optical axis:

$$Z_{0-90}-Z-\theta_t \qquad \text{Eq. 7}$$

2. When the sun's Altitude is Below the Optical Axis, FIG. 3

It can be seen from FIG. 3 geometry that the top tapered side of the prism is irradiated when the altitude of the sun is below the optical axis. The inclination, $Z_0$, of the surface measured from the horizontal plane in a clockwise direction, the same as in FIG. 1(a), becomes $$Z_0 = Z + 90 - \theta_t \qquad \text{Eq. 6}$$

f) Calculation of the Angle of Incidence $\theta_3$ on the Tapered Sides of Prism #1

We are now in a position to substitute actual values for the sun's altitude and azimuth throughout the year on prism surfaces inclined at an angle $Z_0$ to determine the angle of incidence on the acceptor prism #1 found to be important in paragraph 1(a).

References give actual values for the solar altitude, azimuth and total radiation in btu/hr.ft.[2] for each hour of the day on the 21st day of the month for the entire year. Due to symmetry, an adequate evaluation of collector performance for the entire year can be achieved based only on the morning hours for six months beginning on December 21 and ending June 21. These data are entered into IDS Table I.

The related calculated values for $\beta_0$, $\Phi_0$, and $Z_0$ are also listed in IDS Table I and the results entered in Equation 2 to evaluate $\theta_3$.

g) Test Determination of the Angle of Incidence, $\theta_3$, and Correlation with the Calculated Value.

A test apparatus was devised which used a string to simulate the virtual altitudes and azimuths of the sun's rays and to measure the resulting angles between the string and the tapered 5° inside surface of the prism mounted on the surface inclined 40° to the horizontal such as shown on FIG. 3.

Measurement accuracy is estimated to be plus or minus 3° except when the angles approached 90° when the error increased. The measured and calculated data are listed in IDS Tabel II for comparison. Considering the measurement inaccuracies, the correlation between the measured and calculated data is considered to be adequate for validating the calculational procedures and Equation 2.

3. Performance Calculations

Instead of calculating the reflected and refracted path of each ray for each hour of the day of the months listed on IDS Table I, only the worst case is analyzed. The remaining paths will be conservatively represented in the results found for the worst case.

a) Line-Up Between Prismatic Layers

Sketch 3 illustrates the worst-case line-up between layers of prismatic slabs. When the apex of a prism in the layer above abuts an apex in the adjacent layer below, rays emanating from the extreme bottom of the upper apex traverse the maximum possible distance downward in the converging prism below before they reach the side for refraction into the diverging prism. As a result, the rays have fewer reflections (10) in the diverging prism and the reduction of divergence is unsatisfactory. This worst case, however, is not considered to be realistic because when four or five layers are bonded together in random fashion, the lineup between apexes as indicated in sketch 4 is extremely unlikely.

b) Worst-Case Solar Altitude

A second worst case condition arises when the sun's altitude is the same as the optical axis of the prisms, FIG. 3. At these times the sun's rays travel to the extreme bottom of the prism and, similar to the worst case line-up between layers, results in unsatisfactory reduction in divergence in the diverging prism #2. For half of the year, from September 21 to March 21, the altitude of the sun, as can be seen from IDS Table I, is below the optical axis of the prisms. Therefore, the worst case will not exist. For the remaining six months of the year, the rays will only briefly reach the bottom of prism #1 in the first layer twice each day.

c) Line-Up Used in Illustrative Calculations—Factor A

As a result of the above worst-case considerations, a line-up is assumed as indicated on Sketch 5 and the derivation on Sketch 5 is based on the apexes of one layer abutting those of the adjacent layer. A factor "A" is included in Equation 9(a) to account for all other possible line-ups between apexes.

d) Design Criteria

1. Avoid unnecessary refraction, particularly when the ray passes from a lower to a higher index of refraction material. Such refraction is regressive with respect to the goal of reducing divergence from the vertical axis.

2. Adjust indices of refraction to be as small as possible when calculating critical and incident angles related to internal reflection.

3. In the lower layers, do not use values for $\theta_t$ any larger than necessary as indicated by trial and error, for instance, for achieving internal reflection.

4. The range of index of refraction values is limited to ordinary glass and plastic.

e) Second Prismatic Layer—Graphical Method for Determining Angles of Radiation

Sketch 3 depicts prism #1 of the second layer receiving a worst-case ray from prism #2 above at an angle of 20.09 degrees with the vertical axis of the prisms. According to the calculational procedures described in this disclosure, the beam path through lower prisms #1 and #2 is drawn to the calculated angles to reach side #2 of the diverging prism #2. The angle of incidence the beam makes with side #2 is greater than the Critical Angle and the beam is totally internally reflected in the diverging prism to exit at a measured angle of $\theta_2 = 10°$. The reduction in divergence of the beam is:

$$\frac{20.09 - \theta_2}{20.09} = 50\%$$

f) Second Prismatic Layer—Analytical Method for Determining Angles of Radiation

References provide an equation, Eq. 8 on IDS Sketch 4, for calculating the reduction of divergence with the longitudinal axis of a tapered fiber. Sketch 4 revises the use of this equation for diverging prism #2 and confirms the accuracy with the measurements shown on sketch 4. For example, if the ray enters at the small end of the prism and the prism terminates immediately after a reflection at the large end, the measured reduction in divergence is from 60° to 12° and the calculated divergence by means of Eq. 8 is 14°. The measured change in divergence is within about 4% agreement with the calculated divergence. For a long diverging section, the exiting rays will have a divergence between zero degrees to $\theta_t°$ with the axis. The maximum value of 5° occurs because a ray having a divergence less than $\theta_t$ will never reach the tapered sides of the prism to be reduced further. $\theta_t$ on FIG. 5 is 5°, however, the length of the diverging section is not enough to provide the minimum values of 5° or less.

1) Calculational Model

Sketch 5 is a calculational model of the two prisms with geometry representing the line-up of the layers as discussed in paragraph 3(c) above. The derivation on Sketch 5 is based on the geometry to yield an expression for the width, $d_1$, of the diverging prism at the point where the incident ray in prism #1 enters prism #2. The geometry on Sketch 5 also provides an expression for $d_2$, the maximum width of the diverging prism at its bottom. The ratio $d_1/d_2$ is expressed in terms of the dimensions and angles and the ratio is substituted into Equation 8 on Sketch 4 to yield an expression for $\theta_2$, the divergence from the axis of the ray exiting from the layer:

$$\theta_2 = \sin^{-1}\left[\left(\frac{\tan\theta_t}{\tan r_v + \tan\theta_t}\right) \times 2\sin\theta_1\right]$$

Values for $r_v$ and $\theta_1$ are also derived on sketch 6 and substituted into the above equation to yield Equation 9.

2) Divergence Reduction, Equation 9

Equation 9 is derived on Sketch 5.

$$\theta_2 = \sin^{-1}[(A \times \tan\theta_t \div (\tan r_v + \tan\theta_t) \times \sin(90-\theta_t-(\sin^{-1}(\sin(90-r_v-\theta_t) \times n_2 \div n_3))] \quad \text{Eq. 9}$$

where:

A=Line-Up factor (see Sketch 5)

$\theta_2$=Divergence of the ray leaving the layer with the vertical axis $\theta_t$=Taper in the prisms with respect to the vertical axis $r_v$=Entering divergence of the ray with the vertical axis Equation 9 is very interesting because all measurements of distance have disappeared, leaving only angles and the dimensionless ratio $n_2/n_3$. This is significant because the equation implies that the prismatic layers can have any thickness one wishes to assign to them. For instance, the thickness can be 0.01 inches or one inch and $\theta_2$ will have the same value in either case. In the interests of economy in the conserving of material, the thickness can be a small fraction of an inch, the theoretical limit being a thickness approaching that of the length of a typical light wave in the order of 0.000010 inches. There are practical considerations to be made, however, in determining the actual thickness that relates to fabrication tolerances, material optical quality, light absorption, impurities, back-scatter etc. which will limit the thickness to larger values. Such negative attributes will proportionally have a greater affect on thin layers in comparison to the thicker arrays of prisms.

g) Calculation of the Reduction in Divergence $\theta_2$ Produced by Prismatic Layers The first acceptor layer is a special case which sets the value for $n_3$ to affect the operation of the lower layers.

From IDS Table I, the worst-case value of $\theta_3$ of 65° is selected for determining $n_3$ using the trial and error method previously described to find a value, $n_3$=1.43. This value produces the following relationships.

By definition $\theta_3$ is the incident angle on the side of prism #1=$i_1$=65°.

Then:

$r_1 = \sin^{-1}(\sin 65 \times 1.3/1.43)^{(4a)} = 55.48°$ $i_2 = r_1 + 2\theta_t^{(10)} = 65.48°$ $\text{Crit} = \sin^{-1} 1.3/1.43^{(5)} = 65.3°$ Since $i_2$ is greater than Crit, the beam will be internally reflected in Prism #2. This will also be so for all the other values of $\theta_3$ in IDS Table I.

We now turn to a second worst case that occurs at noon on March 21 when $r_s$ is zero and reaches the bottom of Prism #1. Then:

$i_1 = (90-\theta_t) = 85°$ and $r_1 = \sin^{-1}(\sin 85 \times 1.3/1.43) = 64.91°$ $r_1$ makes an angle $\theta_2$ with the vertical of $\theta_2 = 90-(r_1+\theta_t) = 20.09°$ (This value was used in the graphical solution, Sketch 3)

Each layer will produce another value of $r_v$ as the divergence decreases, $r_v$ getting its value from the value found for $\theta_2$ of the preceding layer. Table III lists the data calculated through use of Equation 9. Equation 9 has a constant "A" in the numerator which represents the line-up between the apexes of the prisms at the boundary between layers. A value of 2 for A yields worst-case results when the apexes abut each other (Sketch 3). A value of 1 for A gives results for the situation when the apexes of one layer are at the mid-point between the apexes of the other. Intermediate values for A can represent the degree of randomness judged to occur. Table III data relate to two values of "A"; A=1.5 is judged to be realistic.

TABLE III

CALCULATED DIVERGENCE REDUCTION OF SOLAR RADIATION

| A | Layer | $r_v$ | $\theta_t$ | $n_2$ | $n_3$ | $i_1$ | $r_1$ | $i_2$ | Crit | $\pm\theta_2$ |
|---|---|---|---|---|---|---|---|---|---|---|
| 1.0 | 2 | 20.09 | 5.0 | 1.43 | 1.58 | 64.9 | 55.09 | 65.04 | 64.8 | 5.43 |
| 1.0 | 3 | 5.43 | 2.5 | 1.58 | 1.59 | 82.07 | 79.8 | 84.8 | 83.57 | 2.42 |
| 1.0 | 4 | 2.42 | 1.0 | 1.59 | 1.60 | 86.58 | 82.74 | 84.74 | 83.59 | 1.83 |
| 1.0 | 5 | 1.83 | 0.5 | 1.59 | 1.60 | 87.67 | 83.18 | 84.18 | 83.59 | 1.35 |
| 1.5 | 2 | 20.09 | 5 | 1.43 | 1.58 | 64.9 | 55.04 | 65.04 | 64.8 | 8.3 |
| 1.5 | 3 | 8.43 | 2.5 | 1.58 | 1.61 | 79.07 | 74.49 | 79.49 | 78.92 | 4.41 |
| 1.5 | 4 | 4.41 | 1.0 | 1.61 | 1.62 | 84.59 | 81.65 | 83.65 | 83.63 | 2.03 |
| 1.5 | 5 | 2.03 | 0.5 | 1.62 | 1.63 | 86.97 | 82.97 | 83.97 | 83.65 | 1.96 |

The values for $\theta_2$ are for the worst-case noontime condition when the azimuth is zero. Azimuth angles increase the angles of incidence as can be seen by comparing data listed on IDS Table I for February at 10:00 a.m. and March at 9:00 a.m. when the altitude $\beta_0$ is the same. Therefore, the divergence, $\theta_2$, should be less at other times during the day. This phenomenon applies particularly to diffused radiation which falls on the surface of the collector from all possible angles all the time during the day.

4. Concentration of Radiation a) Optical Concentration

1) Divergence From the Bottom Prismatic Layer

It is thought that a taper $\theta_t$=0.50 is about the minimum value considering practical fabrication problems. From Table III, the minimum value for $\theta_2$ for a worst-case ray exiting from the bottom layer at A=1.5 is ±1.96°. A protective glass, or lens 13, is bonded to the bottom layer of prisms which has a value for $n_4$=1.7. The glass has a convex shape in the north-south direction so as to focus the rays emanating from the bottom prism layer, having $n_3$=1.6, to form a focal line below. A convex shape having a normal diverging 20° from the vertical axis at each edge is arbitrarily assumed. The rays from the prisms at $n_3$=1.6 are refracted by the n=1.7 glass so the refracted rays at the boundary have a divergence reduced from ±1.96° to ±1.84°. The normal to the curvature to the lens at its ends is 20° from the vertical axis hence the angles of incidence at the ends are 21.84° and 18.16° The focal lines drawn from the end of the lens on FIGS. 6A, 6D are the refracted angle, $r_1$, from the normal (radius) to the lens surface at its ends. The beams are refracted into air where n=1 therefore:

$r_1 = \sin^{-1}(\sin 21.84 \times 1.7) = 39.2°$ $r_1 = \sin^{-1}(\sin 18.16 \times 1.7) = 32.2°$ These focal lines are drawn on FIG. 6D to yield a concentration factor of 4.0 that includes the worst-case forms of radiation.

These calculations are repeated for rays at ½ the diameter to obtain a second set of focal lines having refraction angles of 20.4° and 14° to the normal at ½ the diameter. Several other refracted rays from other points on the lens are included.

b) Combination of Optical and Fiber optic Focusing

A close examination of FIG. 6D will reveal that the divergence in the radiation exiting from the bottom layer of the prisms causes focal points above and below the minimum focal area. The points above and below can be recognized by the formation of an X as they cross the vertical axis.

By means of a light funnel 11 shown on FIG. 6A, the longer focused rays that cross the vertical axis below the focal line can essentially be shoved over toward the short focused rays to increase the concentration significantly. The light funnel is designed with tapered walls so that rays entering in the "shoving over" process are trapped in the funnel walls which direct them toward a reduced focal line.

For convenience in subsequent calculations, it is assumed that the width of the lens on FIG. 6B is 12 inches wide (FIG. 6C). It will be of interest on this basis to determine the dimensions of the light funnel.

Scaling from FIG. 6A indicates that the slant height of the funnel is about 9 inches and the minimum (worst-case) angle of incidence, of the longer focal lengths is about 75°. To entrap the rays 12, 13 at this angle of incidence the required taper is calculated as follows:

Angle of refraction into the light funnel $r_1 = \sin^{-1}(\sin 75 \times 1/1.7)$ where the index of refraction of air is 1 and that of the light pipe funnel, 1.7. Evaluating $r_1 = 34.62°$ and $Crit = \sin^{31}\ ^{1}1/1.7 = 36.04°$ In order to be trapped $r_1 + 2\theta_t = Crit$, Solving for $\theta_t$ $\theta_t = 0.71°$ For a 9 inch long tapered wall on the light funnel, the thick end will be greater than the thin top end 17 by an amount expressed by $18 \times \sin 0.7 = 0.22"$ where the light funnel walls join at its bottom, the minimum thickness will therefore be $2 \times 0.22 = 0.44$ inches. The concentration factor for the entrapped rays is $12/0.44 = 27.3$. This concentration factor will also include a substantial proportion of the untrapped rays as can be seen by inspection of FIG. 6A. During the year, the sun occupies all the sky area at one time or another as indicated on IDS Table I. When the sun is not occupying an area the diffused radiation will be focused instead, hence the 27.3 concentration factor includes the diffused radiation.

c) Concentration of Azimuthal Radiation

FIG. 6A relates to the concentration of radiation with respect to the sun's altitude. The azimuth rays from the East-West direction are only reduced from $\Phi$ to $\Phi_4$ by the first acceptor prism layer. The reduction is listed in IDS Table I. The azimuthal rays, therefore, form a focal line having a width of 0.44 inches and extending horizontally across the width of the collector. A second set of prismatic layers bonded at right angles to the bottom of the first set of five individual layers, FIG. 2C, will in turn concentrate the azimuthal radiation in the same manner as described for the top layers. The reduction of the divergence of the azimuthal rays will change the focal line to a focal area in which the intensity of radiation is squared. For example, if the prism acceptor area at the surface of the collector is 12 by 12 inches, the length of the focal line produced by the top layers will be 12 inches without azimuthal concentration. With azimuthal concentration, the line will be reduced to 0.44 inches, the same as calculated in paragraph II(4)(b). The total area on which the sun's rays are now concentrated for one square foot of surface now becomes $0.44 \times 0.44 = 0.1936$ sq. inches. The radiation falling on one square foot of collector surface is therefore concentrated on an area of 0.1936 inches$^2$ to yield a concentration factor of $144/0.1936 = 744$. A two by six foot collector would therefore concentrate the sun's radiation on 12 small areas, FIG. 7C, that can reach exceedingly high temperatures. Energy available at these high temperatures can be used for many other purposes than the mere heating of space at near room temperatures. Several of these uses are discussed above.

5. Absorption of Concentrated Radiation a) Focal Line Receiver

FIGS. 9–10 illustrate two types of Receivers. FIGS. 9A–9B relate to the slab type of geometry which focuses and concentrates the radiation on a focal line across the width of the collector 20. The receiver 18 is a doubled walled pipe having a "C" shaped cross-section through the open end of which passes the converged walls of the light funnel 11. The radiation is directed against the walls of high pressure tubing 38 having a high absorption coefficient. The remaining areas of the tube that do not receive the radiation have a low emissivity, the inner walls of the receiver 39 also have a low emissivity. Relatively cold water returning from the region of use passes through the annular space 40 to be preheated with radiation and convection losses from the three hot tubes to minimize entropy gain and increase the available energy of the output of the hot tubes. FIG. 12A shows the arrangement of the receivers 18 in a 2'×6' collector 20.

b) Thermoelectric Receiver

The second type of receiver, depicted on FIGS. 10A and 10B, relate to prismatic layers that concentrate the radiation in both directions. The radiation is focused on a small area on which it is thermalized to produce high hot junction temperatures. The area and length of the thermoelectric material is adjusted to produce the desired temperature difference across the thermoelectric material based on the collected heat, Q, IDS Table I. The heat is removed at a lower temperature at the cold junction. The temperature of the coolant controls the hot junction temperature.

6. Fabrication Feasibility

The feasibility of the collector depends largely on the inexpensive mass-production of plastic or transparent covers having small grooves in the surfaces.

From Table III data, it is desirable to fabricate prism-shaped grooves having a total taper ($2 \times \theta_t$) of one degree or less.

Fabrication methods have not been investigated; however, there is much experience in existing technology with the production of material with small physical dimensions and such experience is most likely applicable to the production of the prismatic layers. For instance, compact discs and ordinary long playing records have similar grooves and the computer industry deals with microscopic dimensions beyond prism requirements.

Conventional machining means may also be applicable. For example, the use of heat-shrinking plastic would reduce dimensions further after the minimum possible dimensions are machined into the surfaces.

PERFORMANCE SUMMARY

Calculations indicate the focal line concept produces concentration factors as high as 27 which is adequate for producing vapor pressures needed by the VJCP heat pump for achieving collector efficiencies approaching 100% and delivering the heat to the space to be heated and also provide the cooling of space at a rate of about one ton per day per a 2'×6' collector. Alternatively, the concentration of radiation from both the North-South and the East-West directions produces a concentration factor of 744 which is adequate for producing significant quantities of thermoelectricity of nearly one kilowatt-hour per day per a 2'×6' panel. The thermoelectric receiver design can also provide, through use of the heat rejected by the thermoelectric generator, the same amount of heating and cooling as the focal line receiver.

The performance calculated in this disclosure is based on specific values selected to validate the concept. Parametric studies are needed for determining the most economical design, particularly in relation to the depth of the collector which scale measurements indicate is 16 inches for the calculated design. An even deeper collector will provide the room needed to concentrate radiation on the receivers by means of the light funnel alone as can be seen by applying the calculation procedures in section IV 4(b).

ADDITIONAL EMBODIMENT

Introduction

Even higher values of concentration of diffused solar radiation may be achieved with a further embodiment of this invention. The predicted concentrations will provide solar heat at high temperatures even in cloudy overcast days in the winter.

Materials

Glass appears to be a good material to be used for the collimating and concentrating system because of its excellent optical properties and resistance to weathering. However, a brief investigation has not revealed a cost-effective, practical method for manufacturing a glass system because of its fragility, lack of ductility and related poor machining properties. On the other hand, plastics in general are ductile, easy to handle and have good machining and optical properties. Also, plastic products on the open market such as flat, thin plastic lens used as magnifiers, exhibit the use of fabrication techniques that appear to be applicable to low-cost mass production of collimating and concentrating systems. However, plastics are not as good as glass with respect to the damaging effects of weathering and solar radiation.

To take advantage of the best properties of both glass and plastic materials, the first surface is a conventional thin solar collector glass cover that resists weathering and absorbs some of the harmful solar radiation. A plastic collimator and lens assembly is next bonded to the glass to form a single cover in it for the collector. Existing techniques that are used to make the plastic lens can be used to make the thin plastic sheets, of which the collimator is composed as described above.

Collimator Arrangement

Collimation of direct and diffused solar radiation may be achieved more efficiently by arranging the prismatic acceptor slabs vertically, instead of horizontally across the width of the collector as shown on FIG. 7A. Due to the symmetry of the vertical arrangement, each side of the prismatic slabs will in turn accept azimuthal rays, one side in a 0–90 degree range from the East and the other side in the remaining 90–180 degree range from the West. For instance, for a South-facing collector located near Albany, N.Y. and inclined 45 degrees, the maximum azimuthal collection range of 180 degrees can be accommodated by the vertical array with each side of the prismatic slab accepting rays in a 0–90 degree range. The rays issuing from the bottom of the first layer of the collimator will thus have a greater reduction of divergence when both directions are considered compared to the horizontal acceptor array of FIG. 7A.

A further improvement in collimation will result form alternating prismatic slab directions that are below the acceptor layer so that the second layer is horizontal and the third vertical and so on. This arrangement will cause a decrease in divergence in both the azimuthal East-West direction and the altitude North-South direction as the ray proceeds through the layers. Other configurations such as circular slabs may possibly produce a satisfactory reduction in divergence in both directions simultaneously so that all layers have the same slab arrangement.

The following simple design calculations assume a circular perimeter for the collimator-lens units. In actual practice, however, rectangular units should be used to avoid non-functioning space at the surface of the collector.

Design and Fabrication of Collimator-Lens Unit

Flat, plastic lens are available in the open market that produce focal lengths and radiation concentrations similar to those of costly heavy glass lens such as shown on FIGS. 6A and 6B. A simple test (see IDS Sketch 7) of a rectangular 6" by 9" plastic lens, 0.021 inch thick and held perpendicular to the direct rays of the sun (divergence=0.25 degrees), proved that the focused rays can generate temperatures greater than 500° F., the measurement limit of the thermocouple instrumentation used in the test.

FIG. 4A illustrates the configuration of a flat plastic lens designed specifically for focusing the rays from a collimator producing rays that diverge 1.96 degrees from the longitudinal axis of the collimator slabs as listed in Table III. The lens is bonded directly to the bottom layer of the collimator. This collimator-lens combination alone, in direct sunlight, should be adequate for producing temperatures needed for generating steam for the heating and cooling of space with a fixed position collector as described in the text.

Flat, plastic lens available in the marketplace have circular grooves about 0.02 inches apart similar to those shown on FIGS. 4A–4C. The similarity suggests that the same fabrication techniques can be used to make the thin collimator layers of prismatic slabs 1 described above. For instance, a sheet of plastic material having the required index of refraction $n_1$, of the converging prisms (see FIGS. 1 and 2) can be grooved on its underside to form prismatic spaces having the required convergence, $\theta_r$. The result will be a flat sheet of converging slabs on n, material when viewed from the top side. The machined grooves on the underside can then be filled with a liquid or semi-liquid thermoplastic that hardens to form the required diverging prisms of $n_2$ material. This procedure will wet the surfaces of the machined grooves to reduce unwanted reflection from machining irregularities so that total internal reflection can be achieved with minimal scattering of light. The protective glass cover, collimator layers and lens are bonded together to form an assembled unit of a fraction of an inch thick.

Seriesed Collimator-Lens Combination

FIG. 5 illustrates this additional embodiment of a concentrating system. A second small collimator-lens unit 7 is substituted for the light funnel 11. The unit is located at the focal plane F–F' of the primary collimator-lens cover to collimate the focused rays again and refocus them on yet a smaller focal area A–A'. A small light funnel 11 is shown located near the focal plane A–A' to reduce the area by another factor of 16×16×100=25600 to generate high temperatures even on overcast days.

According to IDS Table I, the seasonal variation of the quantity of heat $Q_1$, being transmitted through the cover of the collector is surprisingly small, considering the shorter cloudy days of winter. Existing collectors cannot concentrate diffused radiation, hence a large portion of $Q_1$ that is collected during cloudy weather by conventional collectors is at useless low temperatures. By contrast, the large concentrating capability of the seriesed collimator-lens system of FIG. 5 will deliver $Q_1$ from scattered light at useful high temperatures.

A simple test, Sketch 7, was performed for measuring the increase in temperature of the second collimator-lens unit 7, 10 positioned at the focal plane F–F' to measure the effect of high intensity radiation on the second collimator-lens unit. A piece of glass 2×2½×⅛ inch thick was used to simulate the second collimator-lens unit. The glass was located at the focal plane F–F' of the primary collimator-lens and a shielded thermocouple placed on the glass about ½ inches from the center of the focused rays. When a 6×9 inch flat plastic lens representing the primary collimator-lens cover was held perpendicular to the direct rays from a brightly shining sun, the calibrated thermocouple instrumentation registered temperature rise of only a few degrees F demonstrating that the intense radiation apparently would not damage the second collimator. The ambient air temperature was 32°. When the glass was positioned slightly ahead of the focal plane and a white piece of paper substituted for the glass at the focal plane, it immediately burst into flames proving that the glass had indeed been transmitting the concentrated radiation without being damaged or absorbing a significant amount of the intense radiation. The small size of the second collimator-lens combination may permit the use of more expensive, pure materials to reduce absorption losses and heat-related damage.

There is a radiation loss during its passage through the second collimator-lens and light funnel. Per IDS Table Ad-II, Column 4, $Q_1$, the radiant energy transmitted by the first collimator-lens unit 7, 8 is focused on the second collimator 7 in a 0–20° range of angles of incidence. From IDS Table Ad-1, the reflection from each surface is 4.7% of the radiation being transmitted and the light funnel of FIG. 6A reflects about 10% of the incident radiation. Allowing 4% loss due to absorption by the collimator lens, and 4% by the funnel, the output of the light funnel $Q_{out}$ and the energy concentration $C_c$ become:

$Q_{out} = 0.753 Q_1$ $C_c = 19285 Q_1$

In other words, if practical temperature limitations of the material involved are not exceeded, the radiation passing through the cover will be increased in intensity by a factor of 19,285. Such high concentrations are probably only needed for the fiberoptic transmission of radiation energy. The second collimator alone will produce a concentration $C_e = 223 Q_1$ probably adequate for space heating, cooling and the direct conversion of heat to electricity. The loss of radiation by absorption and reflection in this case is only 13% of $Q_1$. Also in these modes of system operation, the losses can be recovered by the steam-jet heat pump of the system for supplying hot water described above.

Light Funnel Design and Analysis

As for the design of the FIG. 6A light-funnel, some of the design variables are often in opposition; the optimization of the design requires a compromise between them. Identified variables and their opposition are:

1. Location of the funnel along the optical axis vs. funnel size.
2. Location of the funnel along the optical axis vs. angle of incidence.
3. Reflection losses from the inside surface of the funnel vs. acceptance angle.
4. Funnel wall divergence $\theta_r$, vs. concentration (diameter at the base of funnel).
5. Funnel wall divergence $\theta_r$ vs. angle of incidence.
6. Focal length of lens and depth of collector.

One good compromise between the conflicting requirements of the listed variables is the design shown in FIG. 6D.

The purposes of funnel 11 are to conduct concentrated radiation to receivers for the production of photovoltaic or thermoelectric power or for the transmission of radiant energy through light pipes or fiberoptic conductors. A governing design requirement is that the wall divergence $\theta_r$, be adequate for trapping radiation incident on the surface of the funnel and conducting it by total internal reflection to a receiver. (See glossary 5, 8, 10, 12, & 13).

The relation between the required divergence $\theta_r$, and the angle of incidence I, based on the calculational procedure in paragraph IV 4(b) above, is:

$$\theta_r = 0.5(\sin^{-1}(n_1/n_2)) - \sin^{-1}(n_1/n_2 \times \sin i) \qquad \text{Eq. Ad-1}$$

For the values used above for the index of refraction of air and funnel material of respectively $n_1 = 1$ and $n_2 = 1.7$:

$$\theta_r = 0.5(36.032 - \sin^{-1}(0.5882 \times \sin i)) \qquad \text{Eq. Ad-2}$$

Equation Ad-2 was used to determine the configuration and performance of the light shown on FIG. 6D and the related losses caused by reflection from its inside surface. Design data is listed in Tables Ad-1 and Ad-2.

Sketch 8 is a refinement of Sketch 4 in the text that validates the use of Equation 8 in the development of Equation 9.

GLOSSARY

A. Definitions, Optical Laws and Axioms

1. The index of refraction, n, is the ratio of the velocity of light in a vacuum to that in the transmitting medium. Air is assumed to be the same as a vacuum, hence has an index of refraction n=1.
2. The angle of incidence is the angle a light beam makes with the perpendicular to the surface it is entering. The angle of refraction, r, is the angle a beam makes with the same perpendicular in the entered medium.
3. The relations between the indices of refraction, and the angles of incidence and refraction are expressed quantitatively by Snell's Law, $n_1 \sin i = n_2 \sin r$.
4. Corollaries to Snell's law are:
   a) When a beam of light traveling in a medium having an index of refraction, $n_1$, enters at an angle of incidence, i, into the surface of a material having an index of refraction, $n_2$, the refracted angle is expressed by:

$r = \sin^{-1}(\sin i \times n_1/n_2)$ b) Conversely, when the ray enters a material having a lower index of refraction $r = \sin^{-1}(\sin i \times n_2/n_1)$ 5. Light traveling in a material having a higher index of refraction, $n_2$ than $n_1$, the material that bounds it, will be totally internally reflected when the angle of incidence is greater than a critical angle. The critical angle is the angle whose Sine=$n_1/n_2$ expressed as $$\text{Crit} = \text{Sin}^{-1} n_1/n_2$$

When an incident angle is less than Crit, the ray will pass through the boundary. Conversely, when greater than Crit, it will be internally reflected.

6. A light beam traveling through a prism having a triangular cross-section bends away from the apex isolated by its path.
7. Light rays being transmitted through a medium of uniform index of refraction travel in a straight line (excepting cosmic gravitational forces).
8. Light rays traveling in a material having a lower index of refraction can enter at all angles of incidence into a material having a higher index of refraction. In contrast, beams in a higher index material can only pass into a lower index material if the angle of incidence is less than the critical angle.
9. The angle of reflection of a light beam is equal to the angle of incidence.
10. Light rays being internally reflected through a conduit having walls that diverge from the longitudinal axis by an angle $\theta_r$ will increase their angle of incidence with the axis by $2 \times \theta_r$ after each reflection.

Conversely, light rays traveling in the opposite direction will decrease their angle of incidence with the axis by $2 \times \theta_r$.

11. Deleted
12. Light cannot be trapped in a second medium having parallel walls if the angle of incidence of the ray entering the second medium is on one of the parallel sides.
13. If the walls of (12) are not parallel the light can be trapped in the second medium under certain conditions.

I claim:

1. Apparatus for collimating direct and diffused radiation, comprising:

(a) a first collimator for receiving incident radiation, (b) a first lens operatively connected to the collimator, for concentrating radiation transmitted through the collimator, (c) a light funnel for further concentrating radiation that has been concentrated at least in part by the first lens, wherein the light funnel comprises an elongated v-shaped trough member, with two tapered side walls, each side wall having an upper edge and a bottom portion, the bottom portions adjoining each other while the upper edges being widely spaced apart, (d) a receiver positioned to receive radiation that has been focused at least in part by the first lens, and (e) a heat transfer system operatively connected to the receiver, for removing heat or energy from the receiver.

2. The apparatus of claim 1, wherein each tapered side wall widens in thickness from top to bottom.

3. Apparatus for receiving, collimating, concentrating, and absorbing diffused solar radiation, comprising:

(a) a substantially flat and stationary collimator optically positioned to receive, collimate, and transmit diffused solar radiation;

(b) a substantially stationary lens optically positioned to receive, concentrate, and transmit radiation transmitted by the collimator;

(c) a light funnel optically positioned to receive, further concentrate, and transmit radiation that has been concentrated by the lens, the light funnel being wider at its end receiving said radiation than at its end transmitting said further concentrated radiation, wherein the light funnel comprises an elongated v-shaped trough member, with two tapered side walls, each side wall having an upper edge and a bottom portion, the bottom portions adjoining each other while the upper edges being widely spaced apart, and (d) a substantially stationary radiation-absorbing receiver optically positioned to receive and absorb radiation concentrated by the lens.

* * * * *